United States Patent [19]

Schley-May

[11] Patent Number: 5,859,557
[45] Date of Patent: Jan. 12, 1999

[54] METHOD AND APPARATUS FOR IMPLEMENTING DC MODE SELECTION IN A DATA ACCESS ARRANGEMENT

[75] Inventor: James T. Schley-May, Nevada City, Calif.

[73] Assignee: TDK Systems, Inc., Nevada City, Calif.

[21] Appl. No.: 855,090

[22] Filed: May 13, 1997

[51] Int. Cl.⁶ .................................................. H03L 5/00
[52] U.S. Cl. .................... 327/333; 327/108; 327/483; 327/485
[58] Field of Search .................... 327/108–112, 307, 327/308, 478, 482, 483, 485, 333

[56] References Cited

U.S. PATENT DOCUMENTS

| 4,465,981 | 8/1984 | Pike | 330/281 |
| 4,684,880 | 8/1987 | Chan | 323/316 |
| 4,914,402 | 4/1990 | Dermitzakis et al. | 330/308 |
| 5,047,731 | 9/1991 | Lee | 330/282 |
| 5,051,686 | 9/1991 | Schaffer | 323/313 |

*Primary Examiner*—Kenneth B. Wells
*Attorney, Agent, or Firm*—Hecker & Harriman

[57] ABSTRACT

A method and apparatus for implementing DC mode selection in a data access arrangement (DAA). The present invention overcomes the geographic constraints of the prior art by providing a plurality of selectable DC modes. Each of the selectable DC modes may be designed to meet the DC mask specifications of a desired country or region. The apparatus of the present invention may then be utilized in any of the desired countries or regions by selecting the appropriate DC mode. To accommodate several possible DC mask parameters, embodiments of the present invention include selection between a plurality of DC mode voltage levels, selection between current limiting and non-current limiting DC modes, and selection between a plurality of current limit values. Control elements, such as opto-couplers controlled by a microcontroller, are used to perform the selection by enabling and disabling circuit elements or connections. One embodiment provides for temperature compensation of DC current limiting. A thermistor with a negative temperature coefficient compensates for temperature variance in a feedback transistor to maintain stable current limiting performance over a range of temperatures.

25 Claims, 15 Drawing Sheets

METHOD AND APPARATUS FOR IMPLEMENTING DC MODE SELECTION IN A DATA ACCESS ARRANGEMENT

BACKGROUND OF THE INVENTION

1. Field of the Invention

This invention relates to the field of data communication equipment, and in particular to artificial inductors in data access arrangements.

2. Background Art

Telephone systems were originally designed for simple voice communication. As new technologies have emerged, methods have been devised to provide more advanced voice communication functions, as well as to transmit other types of information over telephone lines. These methods typically require the connection of electronic equipment, other than the voice telephone set, to the telephone line. Examples of such equipment include computer modems, facsimile ("fax") machines, answering machines, voice mail systems, phone patches, automatic number identification (ANI) or "Caller ID" systems, and advanced telephone systems.

The electrical characteristics of signals present within the above equipment often differ from the electrical characteristics permitted on a standard twisted-pair telephone line used to connect the equipment to a central office (CO) of the local telephone service provider. An interface circuit referred to as a data access arrangement (DAA) is utilized to couple the equipment to the telephone line. The data access arrangement typically provides isolation, impedance matching, and sometimes amplification, filtering and control functions.

Unfortunately, the specifications for data access arrangements may differ from region to region or country to country to meet the electrical operating parameters of the respective central office. Therefore, a particular data access arrangement has utility only in those countries where the operating specifications are met. The relationship between the data access arrangement and the central office is more clearly understood with reference to a sample data access arrangement as illustrated in FIG. 1.

DATA ACCESS ARRANGEMENT CIRCUIT

FIG. 1 is simplified circuit diagram of a data access arrangement. Transmit (TX) and receive (RX) signal lines are provided on the user side of the circuit for coupling to a modem or other equipment. "Tip" and "ring" lines are provided for coupling to the twisted-pair telephone line on the central office side.

In FIG. 1, the transmit signal (TX) 100 is provided to amplifier 102 of the data access arrangement circuit. The output of amplifier 102 is coupled via impedance 104 to node 105. Receive signal (RX) 101 is extracted from node 105 via amplifier 103. Hybrid transformer 106 comprises a secondary winding coupled between node 105 and a ground voltage or other stable voltage supply node, and a primary winding coupled between node 107 and node 109. Node 107 is coupled to node 121 via capacitor 108. Artificial inductor 110 and protection element 112 are coupled in parallel between nodes 121 and 109. Further coupled between nodes 109 and 121 is a diode bridge comprising diodes 113–116. Ring line 118 is coupled to node 109 via diode 115, and node 121 via diode 116. Tip line 120 is coupled via switch 119 to node 117. Node 117 is coupled to node 109 via diode 113 and node 121 via diode 114.

The tip and ring lines are connected to the central office in the local loop. The diode bridge formed by diodes 113–116 provides for proper operation of the circuit, since the polarity of the tip and ring lines is not known in advance and may differ from site to site.

Protection element 112 provides protection from excessive voltages and typically presents a high impedance to AC and DC signals. One embodiment of protection element 112 may comprise a plurality of Zener diodes. Artificial inductor 110 presents a high impedance to AC signals, but a relatively lower impedance to DC signals. In contrast, capacitor 108 presents a high impedance to DC signals, and a relatively lower impedance to AC signals. Thus, only AC signals pass between the transmit and receive lines and the tip and ring lines via the hybrid transformer. The DC electrical characteristics of the DAA circuit on one side of the hybrid transformer are isolated from those on the other side of the hybrid transformer.

The AC loop is formed from the central office via the tip line through diode 114 (or diode 113 if opposite polarity), capacitor 108, hybrid transformer 106 and diode 115 (or diode 116) to the ring line 118 of the central office. Via hybrid transformer 106, the AC loop also includes node 105. The modem, or local device, can read the AC signal from node 105 via amplifier 103 and receive signal 101, or append an AC signal to node 105 via transmit signal 100 and elements 102 and 104.

The DC operating point for many of the elements in the DAA circuit are set by the DC loop shown in FIG. 2. The DC loop comprises central office 200, diode 114, artificial inductor 110, and diode 115. The AC and DC loops are completed when switch 119, coupling node 117 to tip line 120, is closed, i.e., when the telephone line is considered "off hook".

In simplified form, the central office 200 may be represented by a DC voltage source in series with a large resistance. In FIG. 2, these elements are identified as $V_{DC,CO}$ and $R_{CO}$. With the DC loop completed, a DC current $I_{DC}$ is driven through artificial inductor 110, and DC voltage V is generated across the artificial inductor. The relationship between the voltage V and current $I_{DC}$ is referred to as the DC characteristics or "DC mode" of the artificial inductor.

The DC characteristics of the artificial inductor determine the DC characteristics for all elements in the DC loop, including the central office. Typically, to implement standard circuit operation at the central office with any modem or device coupled to the telephone line, the DC characteristics of the artificial inductor are constrained to predetermined parameter ranges. As previously stated, these predetermined parameter ranges may differ from country to country, limiting the application of any single DC mode. The design of the artificial inductor circuit is therefore critical to the utility of the data access arrangement and the associated device (e.g., modem, etc.) with respect to a single location. As these data access arrangements are often used with laptop modems or other portable equipment, utility in international travel (i.e., with respect to use in multiple countries) is also an issue.

ARTIFICIAL INDUCTOR CIRCUITS

To better understand how an artificial inductor establishes a DC mode in the data access arrangement, a simplified artificial inductor circuit of the prior art is shown in FIG. 3. The circuit must behave like an inductor with respect to frequency response, and must provide a well-defined voltage-current relationship at DC.

In FIG. 3, the artificial inductor circuit comprises capacitor CB, resistors $R_1$, $R_2$ and $R_E$, and Darlington transistor pair Q1, consisting of transistors Q1A and Q1B. The collectors of transistors Q1A and Q1B are coupled to node 121. The emitter of transistor Q1A is coupled to the base of transistor Q1B, and the emitter of transistor Q1B is coupled through resistor $R_E$ to node 109. The base of transistor Q1A is coupled to node 300. Resistor $R_1$ is coupled between node 121 and node 300, and resistor $R_2$ and capacitor CB are coupled in parallel between node 300 and node 109.

For simplicity, the collectors of transistors Q1A and Q1B are referred to as the collector of transistor pair Q1; the base of transistor Q1A is referred to as the base of transistor pair Q1; and the emitter of transistor Q1B is referred to as the emitter of transistor pair Q1. Conceivably, a single high-current-gain transistor may be used in place of the Darlington transistor pair Q1. The Darlington pair shown in FIG. 3 comprises npn BJT transistors.

The current gain of Darlington transistor pair Q1 is sufficiently large that the base current of transistor Q1A is negligible in the following discussion. Resistors $R_1$ and $R_2$ are large enough so as not to present a significant load to the central office. Therefore, when Darlington transistor pair Q1 is conducting, only a relatively negligible amount of the DC current $I_{DC}$ flows through resistors $R_1$ and $R_2$. Typical value ranges for the elements of FIG. 3 are: $R_1$, $R_2 \approx 20$ kΩ–200 kΩ; $R_E < 100$ Ω; and CB≈0.1 µF–10 µF.

For AC signals, capacitor CB effectively shorts any voltage across resistor $R_2$, attenuating any AC current in transistor pair Q1. The effective AC resistance of the artificial inductor approaches the relatively large resistance of resistor $R_1$.

When transistor pair Q1 is not conducting, i.e., when the voltage across resistor $R_2$ does not exceed $2V_{BE}$ (the turn-on base-emitter voltage of transistor pair Q1), the DC mode is determined by resistors $R_1$ and $R_2$ as follows (where, for simplicity, $R_X$ also refers to the resistance value of element $R_X$):

$$V(I_{DC}) \approx I_{DC}(R_1+R_2) \quad \text{[Equation 1]}$$

For $R_1$ and $R_2 >> R_E$, when transistor pair Q1 is conducting, the DC mode is approximately given by:

$$V(I_{DC}) \approx (I_{DC}R_E + 2V_{BE})(1 + R_1/R_2) \quad \text{[Equation 2]}$$

FIG. 4A illustrates the DC mode of the circuit of FIG. 3. Curve 400 represents the voltage V vs. current $I_{DC}$ for the artificial inductor circuit. Line 401 represents the voltage vs. current of the central office based upon the example central office equivalent DC circuit comprising voltage supply $V_{DC,CO}$ and resistance $R_{CO}$.

Curve 400 begins at the origin and rises linearly at a slope equal to approximately $R_1+R_2$. This represents the resistance across the artificial inductor prior to transistor pair Q1 turning on. Transistor pair Q1 begins conducting when the voltage V is approximately equal to $2V_{BE}(1+R_1/R_2)$, and the current $I_{DC}$ is approximately equal to $2V_{BE}/R_2$. After transistor pair Q1 begins conducting, the slope of curve 400 adjusts to approximately $R_E(1+R_1/R_2)$.

Line 401 begins with zero current and a voltage of $V_{DC,CO}$, which falls linearly with increasing current at a slope of approximately $-R_{CO}$. The equation for line 401 is:

$$V(I_{DC}) \approx V_{DC,CO} - R_{CO}I_{DC} \quad \text{[Equation 3]}$$

Point 402 represents the intersection of curve 400 and line 401, and thus a stable DC bias point for the DC loop containing the artificial inductor and the central office.

FIG. 4B illustrates a voltage limiting mask used to specify permitted ranges of DC characteristics for data access arrangements in, for instance, European countries. The upper hatched region represents impermissible DC bias points for the DAA circuit. A lower hatched region may also be provided in the mask, setting a lower limit on voltage over a current range.

The DC mode of the artificial inductor must meet the specifications presented by the DC mask of the respective country or region in which the DAA is being utilized. Appropriate resistance values for resistors $R_1$, $R_2$ and $R_E$ are chosen such that the particular DC specification mask is satisfied. However, because different countries have different DC masks, the utility of the artificial inductor, and the associated DAA circuit, is limited to use in the country whose mask forms the basis for the selected resistor values. This geographically constrained utility undesirably limits the market for each device. Further, it poses an inconvenience and extra cost for travelers who must purchase separate units to use such circuits in different countries.

SUMMARY OF THE INVENTION

The present invention provides a method and apparatus for implementing DC mode selection in a data access arrangement (DAA). The present invention overcomes the geographic constraints of the prior art by providing a plurality of selectable DC modes. Each of the selectable DC modes may be designed to meet the DC mask specifications of a desired country or region. The apparatus of the present invention may then be utilized in any of the desired countries or regions by selecting the appropriate DC mode.

To accommodate several possible DC mask parameters, embodiments of the present invention include selection between a plurality of DC mode voltage levels, selection between current limiting and non-current limiting DC modes, and selection between a plurality of current limit values. Control elements, such as opto-couplers controlled by a microcontroller, are used to perform the selection by enabling and disabling circuit elements or connections.

In a first embodiment, a first control element determines the voltage level of the selected DC mode by enabling or disabling a parallel resistance in a voltage divider. A second control element enables or disables current-limiting by enabling or disabling a feedback transistor. A third control element determines the maximum current for current-limited DC modes by altering the gain of a voltage divider circuit in the feedback loop.

In a second embodiment, the number of control elements is minimized while providing a wide range of DC modes. A diode is placed in series with a voltage divider to provide a voltage offset for the chosen DC mode when active. The diode is also in series with the feedback transistor, modifying the turn-on value of the feedback transistor and hence the maximum current of the DC mode. A first control element is used to enable the diode or short the diode as desired. A second control element is used to enable or disable the feedback transistor. Four different DC modes are thus generated. A partitioned resistance arrangement may be used to provide independence between the design of maximum current values and selectable voltage levels.

A further embodiment provides for temperature compensation of the DC current. A thermistor with a negative temperature coefficient compensates for temperature variance in $V_{BE}$ of the feedback transistor to maintain stable current performance over a range of temperatures. This temperature compensation is of particular benefit in current limiting modes to prevent drift of the maximum current value with temperature.

DETAILED DESCRIPTION OF THE INVENTION

The present invention is a method and apparatus for implementing DC mode selection in a data access arrangement (DAA). In the following description, numerous specific details are set forth to provide a more thorough description of the present invention. It will be apparent, however, to one skilled in the art, that the present invention may be practiced without these specific details. In other instances, well known features have not been described in detail so as not to obscure the present invention.

The present invention allows for selection of a plurality of DC modes to accommodate the varying requirements of DC masks for different countries. Parameters that vary among different countries include (1) voltage level, (2) current limiting or non-current limiting behavior, and (3), for current-limiting countries, maximum current levels. Description is provided below for accomplishing selection of each of these parameters individually. Embodiments of the invention providing selection of all three parameters will then be disclosed.

Selectable Voltage Level in DC Modes

Figure 1:
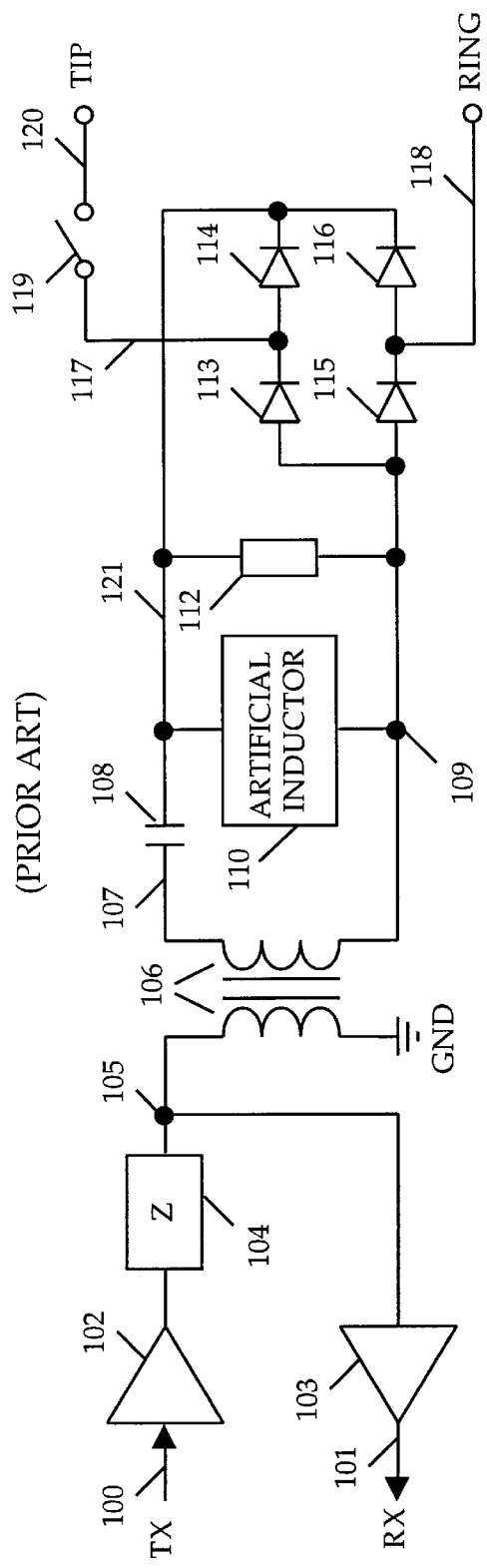
FIG. 1 is a simplified circuit block diagram of a data access arrangement.
Figure 2:
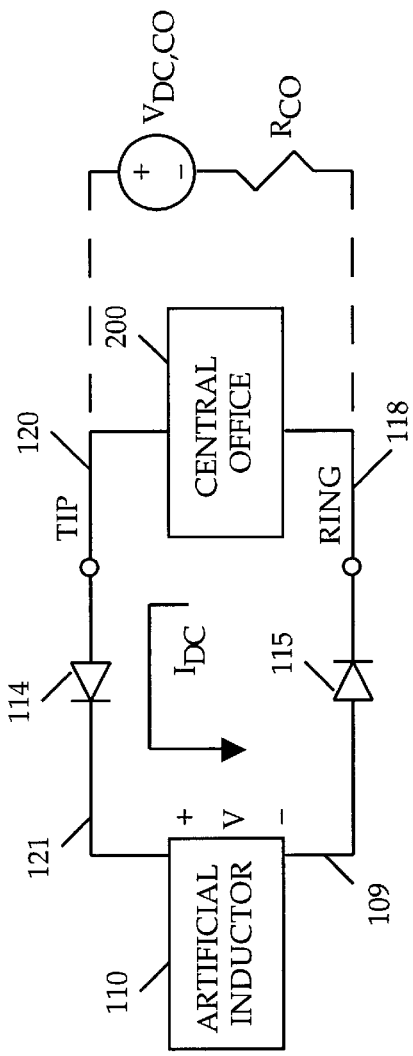
FIG. 2 is a simplified circuit block diagram of the DC loop formed by the data access arrangement and the central office.
Figure 3:
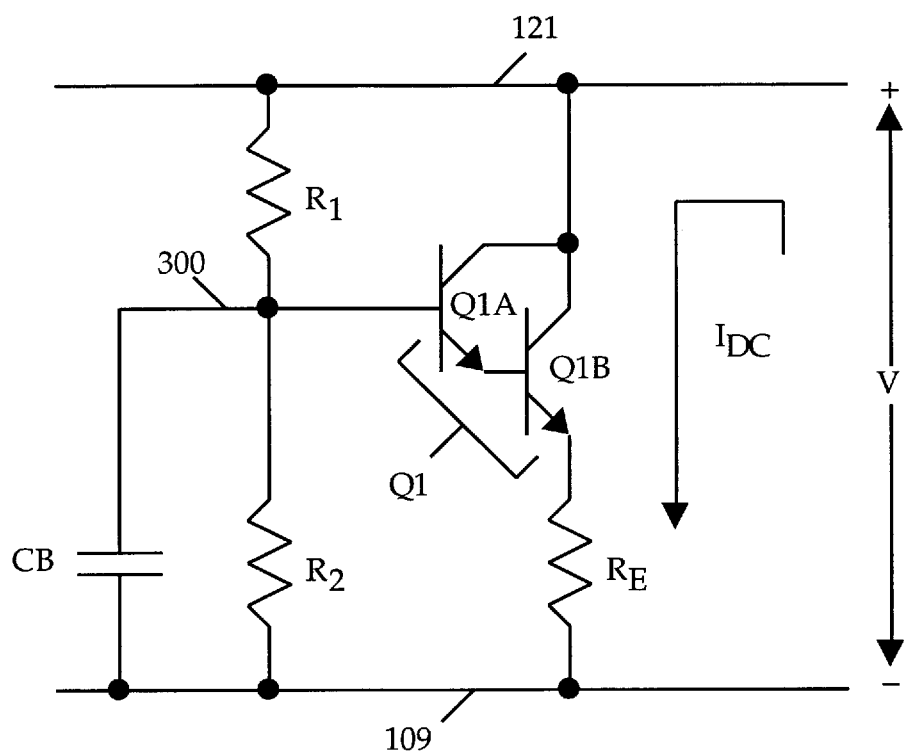
FIG. 3 is a simplified circuit diagram of an artificial inductor of the prior art.
Figure 5:
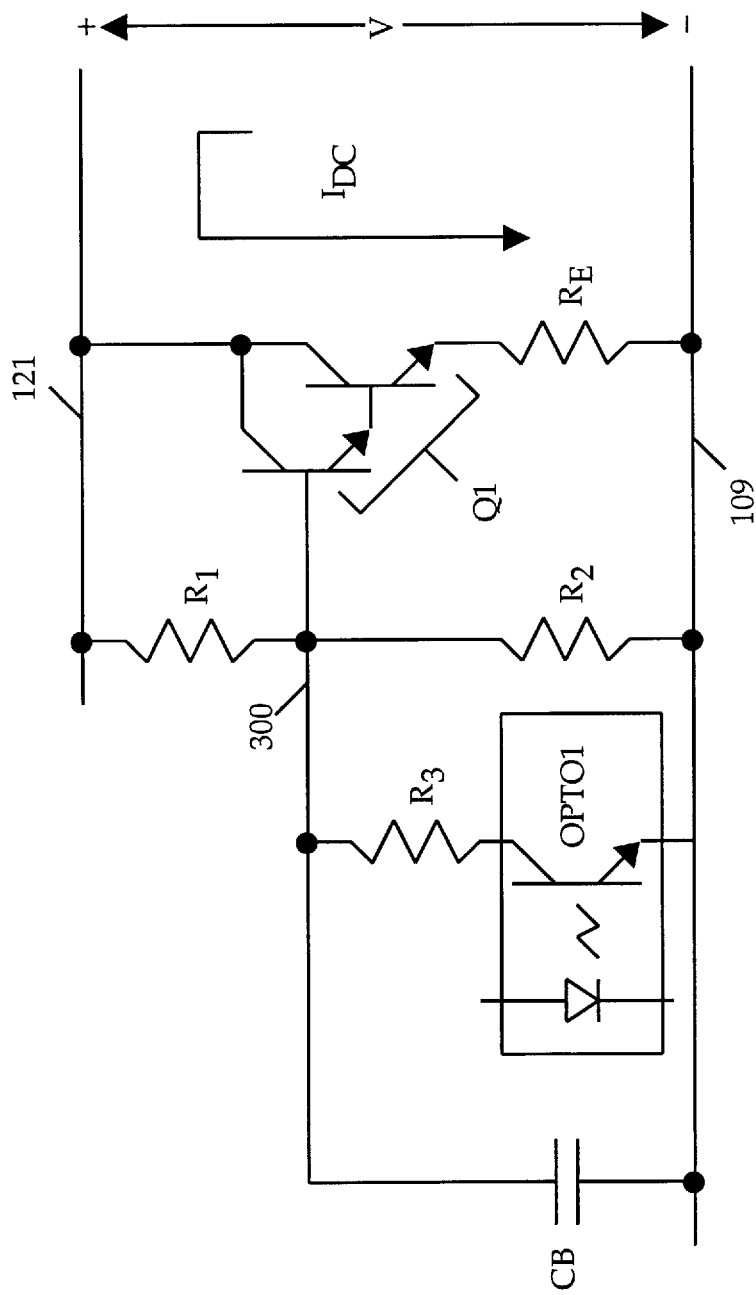
FIG. 5 is a simplified circuit diagram of an artificial inductor having two voltage-selectable DC modes.

FIG. 5 illustrates an artificial inductor circuit that provides for two selectable DC modes to accommodate two different voltage-limiting masks. Similarly to the circuit of FIG. 3, the collector of transistor pair Q1 is coupled to node 121 and the base is coupled to node 300. The emitter of transistor pair Q1 is coupled via resistor $R_E$ to node 109. Resistor $R_1$ is coupled between nodes 300 and 121, and resistor $R_2$ is coupled between nodes 300 and 109. Capacitor CB is coupled between node 300 and 109. Unlike the circuit of FIG. 3, in FIG. 5, resistor $R_3$ and control element OPTO1 are coupled in series between nodes 300 and 109. Preferably, the values $R_1$, $R_2$ and $R_2 \| R_3$ are at least ten times the value $R_E$.

Control element OPTO1 acts as a closed switch when it is on, and as an open switch when it is off. Any sort of transistor or other controllable switching element may be used for this function. However, in DAA circuit applications, opto-couplers are often preferred because they provide galvanic isolation between the DAA circuit and the controller circuitry of the modem or other connected device. Galvanic isolation is important in telephone line circuits because the voltages on the central office side of the hybrid transformer may differ from the voltages in the modem circuit by upwards of fifteen hundred volts due to lightning or coupling of the telephone lines with nearby power lines.

Regardless of the type of control element used, when control element OPTO1 is on, resistor $R_3$ is effectively coupled in parallel with $R_2$ and capacitor CB. When control element OPTO1 is off, resistor $R_3$ is effectively removed from the circuit. Thus, with control element OPTO1 off, the circuit of FIG. 5 behaves similarly to the circuit of FIG. 3.

When the control element OPTO1 is on, resistor $R_3$ reduces the resistance between node 300 and node 109. This has the effect of reducing the DC resistance prior to transistor pair Q1 turning on, and increasing the effective resistance after Q1 turns on. Further, the voltage V at which Q1 begins conducting is increased due to the modification of the voltage divider formed by resistors $R_1$ and $R_2$. The DC mode of the artificial inductor, with transistor pair Q1 conducting and control element OPTO1 on, is defined by:

$$V(I_{DC}) \approx (I_{DC}R_E + 2V_{BE})\left(1 + \frac{R_1}{R_2\|R_3}\right) \quad \text{[Equation 4]}$$

where $$R_2\|R_3 \approx \left(\frac{R_2 R_3}{R_2 + R_3}\right) \quad \text{[Equation 5]}$$

Figure 4A:
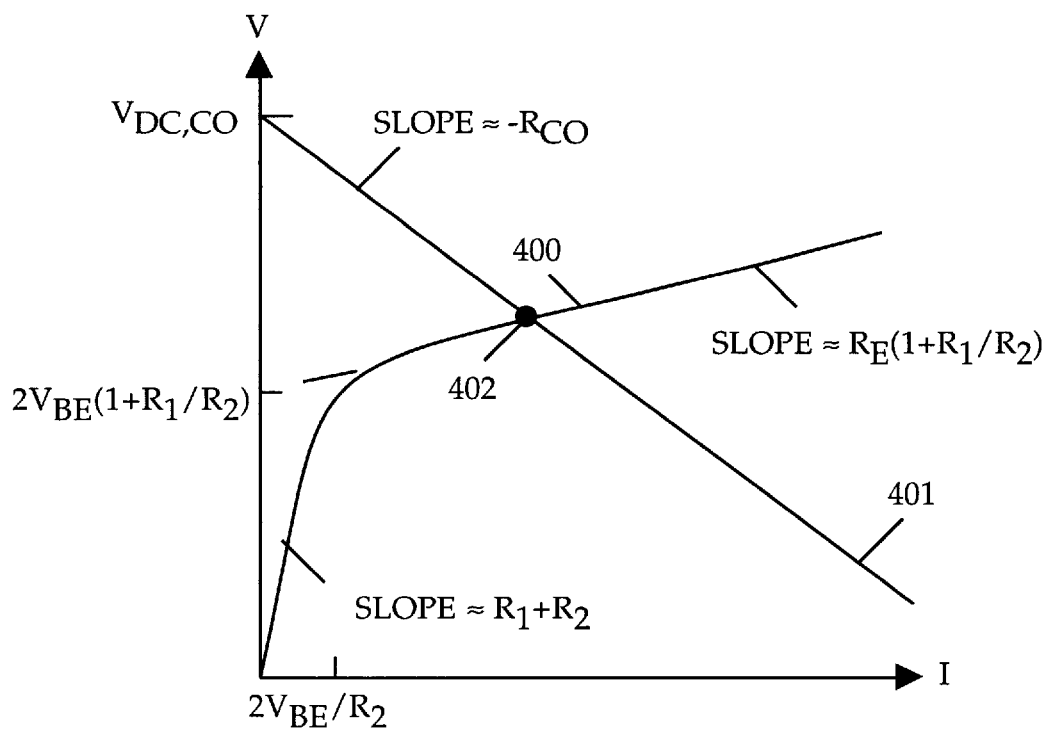
FIG. 4A illustrates the DC characteristics of the artificial inductor of FIG. 3 in terms of voltage and current.
Figure 4B:
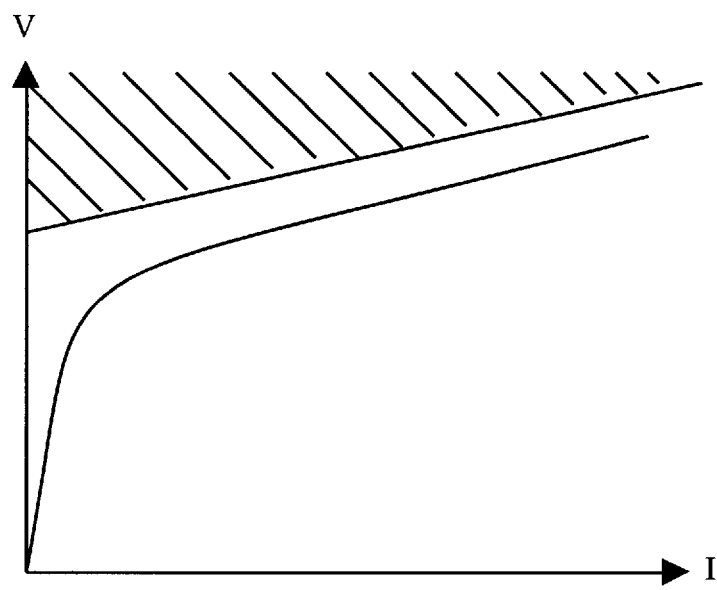
FIG. 4B illustrates a voltage limiting DC mask used by some European countries to specify permitted data access arrangement DC characteristics.
Figure 6:
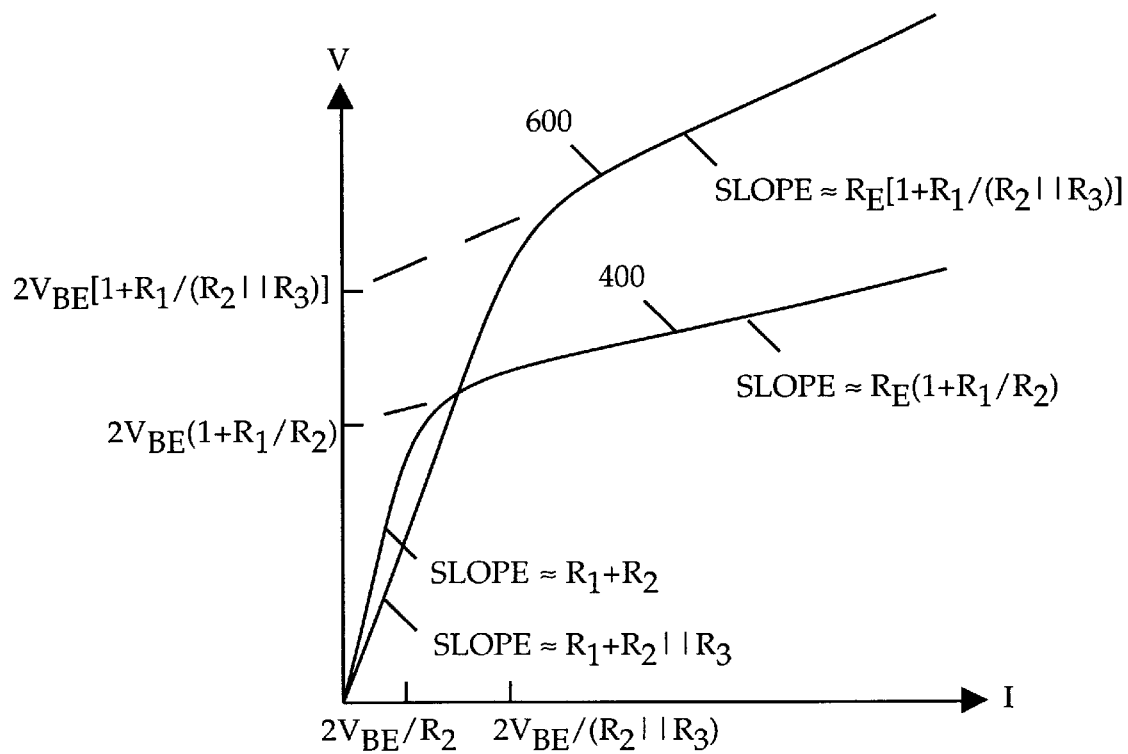
FIG. 6 illustrates the selectable DC modes for the circuit of FIG. 5 in terms of current.

FIG. 6 illustrates the selectable DC modes of the circuit of FIG. 5. Curve 400 represents the DC mode of circuit of FIG. 5 when control element OPTO1 is off, and is substantially the same as curve 400 from FIG. 4. Curve 600 represents the DC mode of the circuit of FIG. 5 when control element OPTO1 is on. Curve 600 begins at the origin and rises at a slope equivalent approximately to the resistance of resistors $R_2$ and $R_3$ in parallel plus the resistance of resistor $R_1$. With control element OPTO1 turned on, transistor pair Q1 begins conducting when the voltage V is approximately $2V_{BE}$ $(1+R_1/(R_2 \| R_3))$ and the current $I_{DC}$ is approximately $2V_{BE}/(R_2 \| R_3)$. After transistor pair Q1 begins conducting, curve 600 rises at a slope of approximately $R_E$ $(1+R_1/(R_2 \| R_3))$ By selecting appropriate values for resistors $R_E$, $R_1$, $R_2$, and $R_3$, curves 400 and 600 can be designed to accommodate two different DC mask specifications. The appropriate DC mode can then be selected by turning control element OPTO1 on or off.

II. Selectable Mode for Current Limiting

Figure 7:
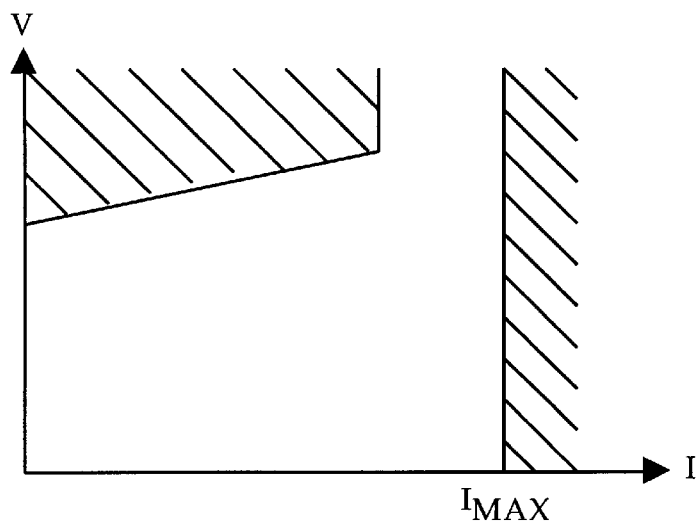
FIG. 7 illustrates a voltage limiting and current limiting DC mask used by some European countries to specify the DC characteristics permitted for data access arrangements.

In some countries, the DC mask includes a current limiting aspect. Such a mask is illustrated in FIG. 7. The mask of FIG. 7 includes an upper voltage limiting region and a separate current limited region. For a small current range below a maximum current $I_{MAX}$, the voltage is unlimited. To accommodate countries having such a current limited DC mask, the artificial inductor circuit must be equipped with current limiting circuitry. Such an artificial inductor is illustrated in FIG. 8.

Figure 8:
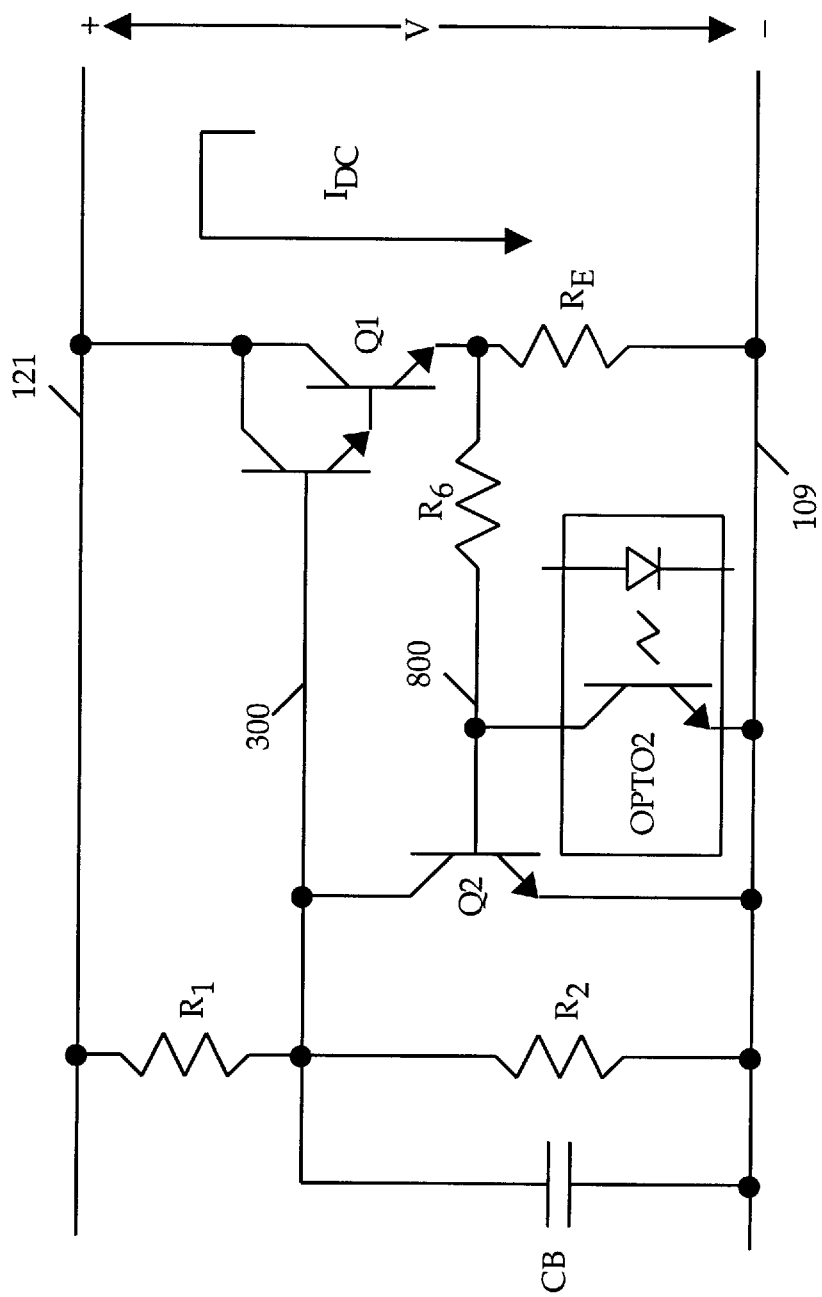
FIG. 8 is a simplified circuit diagram of an artificial inductor having selectable current limiting and non-current limiting DC modes.

In FIG. 8, the collector of Darlington transistor pair Q1 is coupled to node 121, and the base is coupled to node 300. The emitter of Darlington transistor pair Q1 is coupled via resistor $R_E$ to node 109. Resistor $R_1$ is coupled between node 121 and node 300. Capacitor CB and resistor $R_2$ are coupled in parallel between node 300 and node 109. The collector of npn BJT transistor Q2 is coupled to node 300, and the emitter is coupled to node 109. The base of transistor Q2 is coupled to node 800. Resistor $R_6$ is coupled between the emitter of transistor pair Q1 and node 800. Control element OPTO2 is coupled between node 800 and node 109.

The current limiting circuitry of FIG. 8 comprises control element OPTO2 and resistor $R_6$. Resistor $R_6$ is provided to isolate the base of transistor Q2 from the emitter of transistor pair Q1 and resistor $R_E$. Resistor $R_6$ is large with respect to resistor $R_E$. With control element OPTO2 turned on, resistor R6 is effectively coupled in parallel with resistor $R_E$. However, due to the relatively larger size of resistor $R_6$, the equivalent resistance is approximately that of resistor $R_E$ alone.

When control element OPTO2 is on, node 800 is pulled to approximately the voltage level of node 109, preventing transistor Q2 from turning on. Thus, when control element OPTO2 is on, the current limiting circuitry is disabled. If control element OPTO2 is off, transistor Q2 turns on when the voltage across resistor $R_E$ rises to $V_{BE}$, the transistor base-emitter turn-on voltage. The maximum current with control element OPT02 off is thus $$I_{MAX} \approx V_{BE}/R_E \qquad \text{[Equation 6]}$$

While conducting, transistor Q2 provides negative feedback to node 300. The negative feedback substantially prevents the voltage at node 300, and the voltage across resistor $R_E$, from increasing, thus limiting the current $I_{DC}$ through resistor $R_E$. Any increase in voltage is absorbed across resistor $R_1$, with the relatively negligible excess current passing through transistor Q2.

Figure 9:
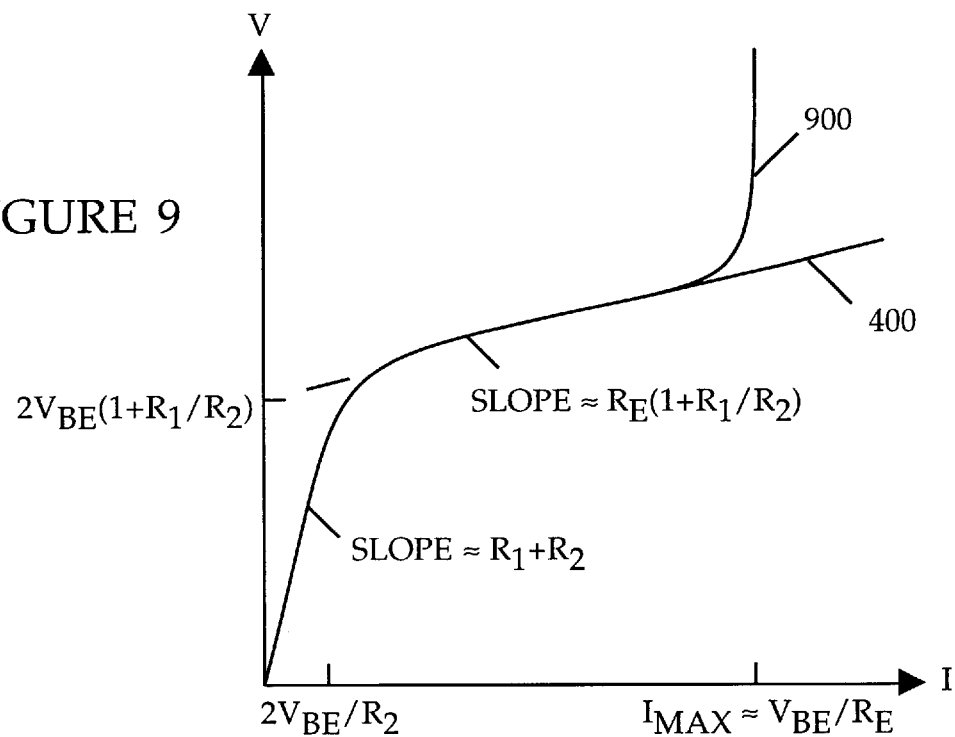
FIG. 9 illustrates the selectable current limiting DC modes provided by the circuit of FIG. 8.

FIG. 9 illustrates the selectable current limiting DC modes provided by the circuit of FIG. 8. Curve 400 represents the DC mode without the current limiting selected, i.e., with control element OPTO2 turned on. Curve 900 represents the DC mode with current limiting selected, i.e., with control element OPTO2 turned off. Curves 400 and 900 are substantially similar until the current limiting point is reached. Both curves begin at the origin and rise with the slope equal to approximately $R_1+R_2$. Darlington transistor pair Q1 turns on when the voltage V is approximately equal to $2V_{BE}$ $(1+R_1/R_2)$, and the current $I_{DC}$ is equal to approximately $2V_{BE}/R_2$. Once Darlington transistor pair Q1 is turned on, curves 400 and 900 rise with a slope equal to approximately $R_E$ $(1+R_1/R_2)$. Curve 400 continues at this rate, whereas curve 900 reaches a maximum current as described of approximately $V_{BE}/R_E$.

III. Multiple Current—Limiting Modes

As some countries have differing voltage limits for the DC masks, some countries also have different levels of current limiting. Therefore, a maximum current level must be provided for each different current limiting mask. The circuit of FIG. 10 provides for two levels of current limiting by placing a voltage divider with selectable resistance in the current limiting feedback path.

Figure 10:
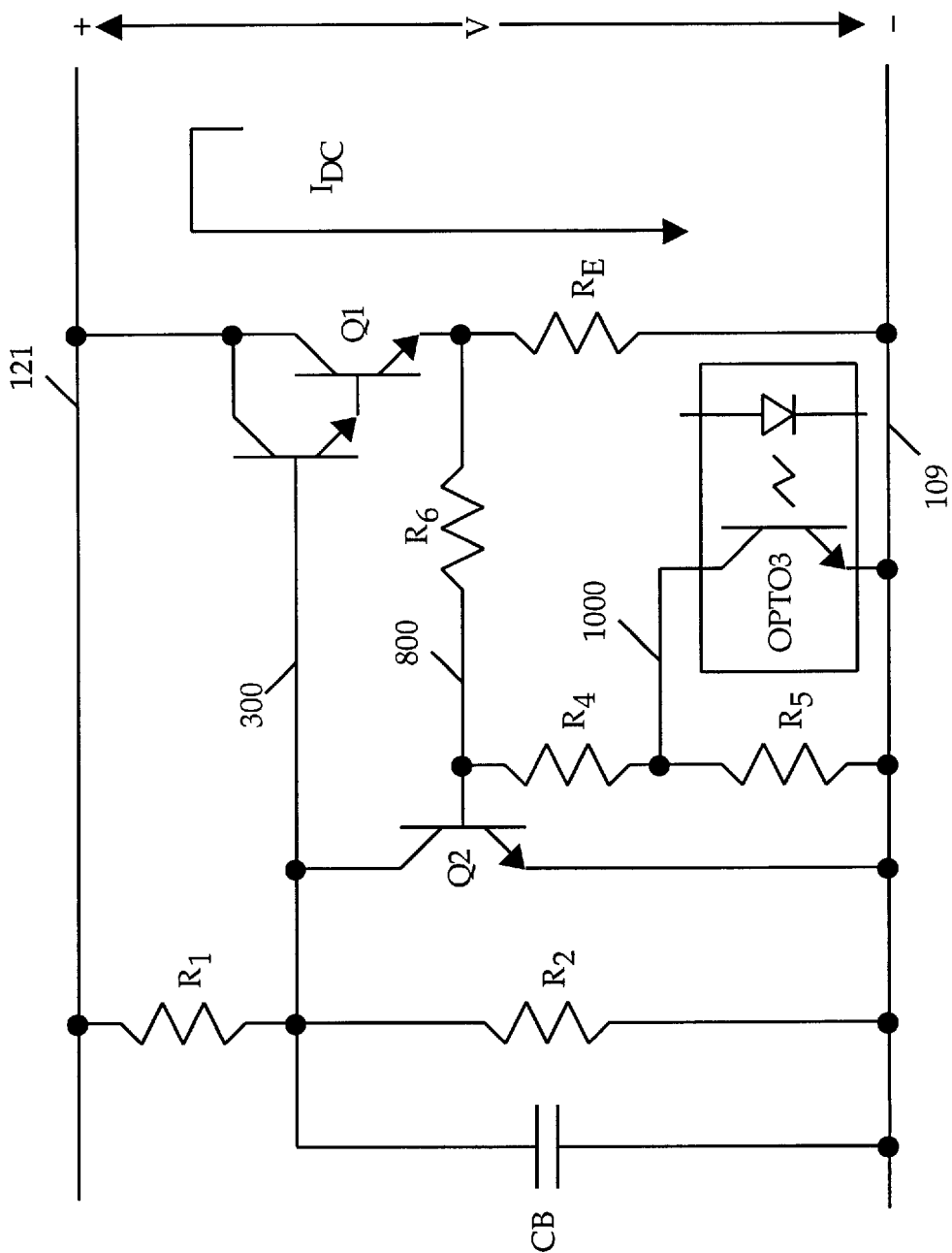
FIG. 10 is a simplified circuit diagram of a current limited artificial inductor having two selectable maximum current levels.

In FIG. 10, the collector of Darlington transistor pair Q1 is coupled to node 121, and the base is coupled to node 300. The emitter of Darlington transistor pair Q1 is coupled via resistor $R_E$ to node 109. Resistor $R_1$ is coupled between nodes 300 and 121. Capacitor CB and resistor $R_2$ are coupled in parallel between nodes 300 and 109. The collector of transistor Q2 is coupled to node 300, and the base is coupled to node 800. The emitter of transistor Q2 is coupled to node 109. Resistor $R_6$ is coupled between the emitter of Darlington transistor pair Q1 and node 800. Resistor $R_4$ is coupled between node 800 and node 1000. Resistor $R_5$ and control element OPTO3 are coupled in parallel between node 1000 and node 109.

Transistor Q2 is responsible for limiting the current when the voltage at node 800 reaches the base emitter turn-on voltage $V_{BE}$. However, the voltage at node 800 is a function of the voltage at the emitter of Darlington transistor pair Q1 and voltage division between resistor $R_6$ and resistors $R_4$ and $R_5$. When control element OPTO3 is on, voltage division takes place only between resistors $R_4$ and $R_6$, whereas when control element OPTO3 is off, voltage division if performed between resistor $R_6$ and the series resistance of resistors $R_4$ and $R_5$. Thus, two selectable values of current limiting are provided.

With control element OPTO3 on, the maximum current is $$I_{MAX1} \approx (V_{BE}/R_E)(1 + R_6/R_4) \qquad \text{[Equation 7]}$$

With control element OPTO3 off, the maximum current is $$I_{MAX2} \approx (V_{BE}/R_E)\left(1 + \frac{R_6}{(R_4+R_5)}\right) \qquad \text{[Equation 8]}$$

Figure 11:
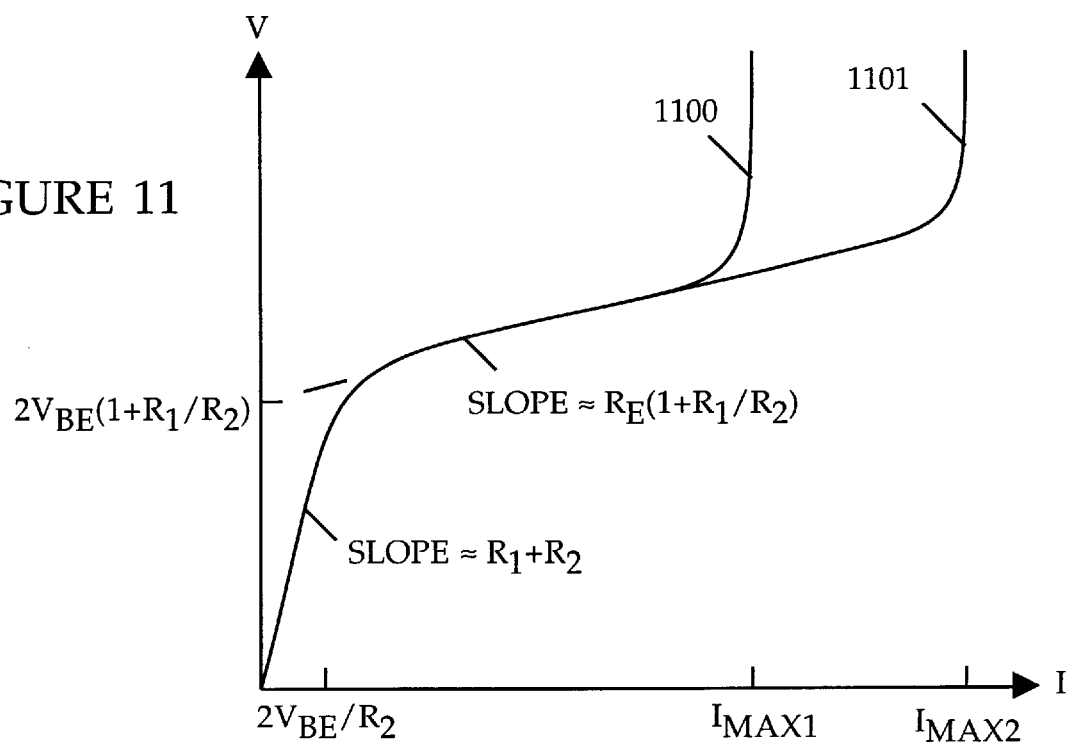
FIG. 11 illustrates the two selectable current limited DC modes of the circuit of FIG. 10.

FIG. 11 illustrates the selectable current limiting provided by the circuit of FIG. 10. Curve 1100 represents the DC mode when control element OPTO3 is off. Curve 1101 illustrates the DC mode when control element OPTO3 is turned on. Both curves begin at the origin and rise with a slope of approximately $R_1+R_2$ until Darlington transistor pair Q1 turns on at a current $I_{DC}$ equal to approximately $2V_{BE}/R_2$, and voltage V of approximately $2V_{BE}$ $(1+R_1/R_2)$. After this point, both curves rise at a slope of approximately $R_E$ $(1+R_1/R_2)$, until the respective maximum current values are reached. Curve 11 reaches a current limit at current $I_{MAX1}$ and curve 1101 reaches a current limit at current $I_{MAX2}$.

IV. Multiple DC Modes Implemented Using a Plurality of Control Elements

Figure 12:
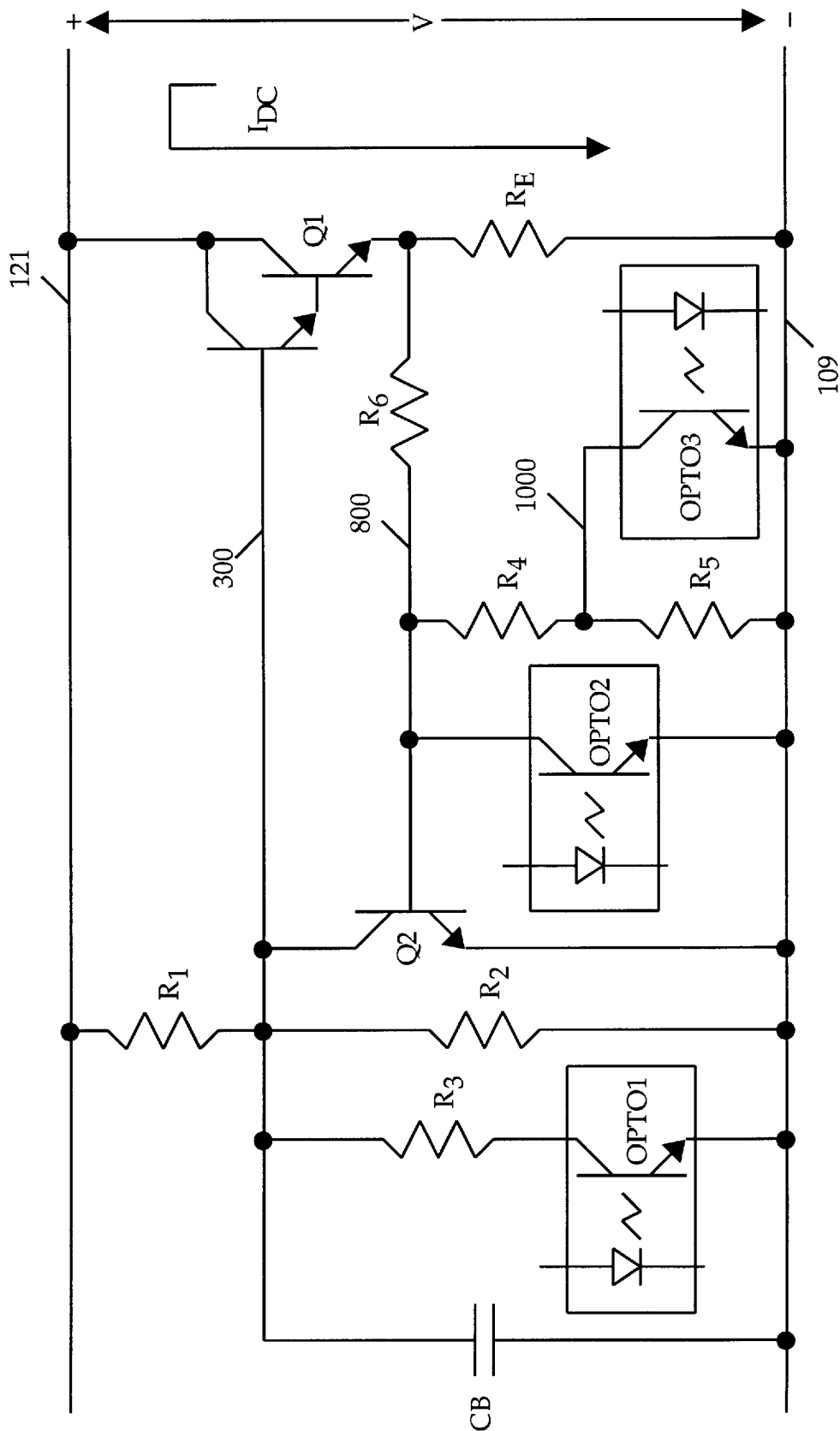
FIG. 12 is a circuit diagram of an artificial inductor providing two voltage-selectable DC characteristics, each having a selectable non-current limited mode and two selectable current limited modes.

FIG. 12 is a circuit diagram of an artificial inductor which provides for selection between two different voltage levels, selection between current limiting and non-current limiting DC modes, and selection between two current limit values, $I_{MAX1}$ and $I_{MAX2}$. DC mode selection is accomplished in this embodiment with three control elements: OPTO1, OPTO2, and OPTO3.

In the circuit of FIG. 12, the collector of Darlington transistor pair Q1 is coupled to node 121, and the base is coupled to node 300. The emitter of Darlington transistor pair Q1 is coupled to node 109 via resistor $R_E$, and node 800 via resistor $R_6$. Resistor $R_1$ is coupled between nodes 121 and 300. Resistor $R_2$ and capacitor CB are coupled in parallel between node 300 and node 109. Resistor $R_3$ and control element OPTO1 are coupled in series between node 300 and node 109. The collector of transistor Q2 is coupled to node 300, the emitter of transistor Q2 is coupled to node 109, and the base is coupled to node 800. Control element OPTO2 is coupled between node 800 and node 109. Resistor $R_4$ is coupled between node 800 and node 1000, and resistor $R_5$ and control element OPTO3 are coupled in parallel between node 1000 and node 109.

Control element OPTO1 is used to select between the two voltage values of the DC characteristics. Control element OPTO2 is used to select between current limiting and non-current limiting DC modes. Control element OPTO3 is used in the current limiting DC modes to select between the two possible maximum current values. The table below identifies the different DC modes of FIG. 12.

current limiting at maximum current $I_{MAX2}$. Curves 400 and 600 are not current limited. Curves 400, 1100 and 1101 begin at the origin and rise with the slope of approximately $R_1+R_2$, and transition into a slope of approximately $R_E$ $(1+R_1/R_2)$ after transistor pair Q1 turns on. For curves 400, 1100 and 1101, transistor pair Q1 turns on at a voltage V of approximately $2V_{BE}$ $(1+R_1/R_2)$, and current $I_{DC}$ of approximately $2V_{BE}/R_2$.

Curves 600, 1300 and 1301 begin at the origin and rise with a slope approximately $R_1+R_2\|R_3$, and transition to a slope of approximately $R_E$ $(1+R_1/(R_2\|R_3))$ after transistor pair Q1 turns on. Transistor pair Q1 turns on for curves 600, 1300, and 1301 at a voltage V of approximately $2V_{BE}$ $(1+R_1/(R_2\|R_3))$, and current $I_{DC}$ of approximately $2V_{BE}$ $(R_2\|R_3)$.

Figure 14:
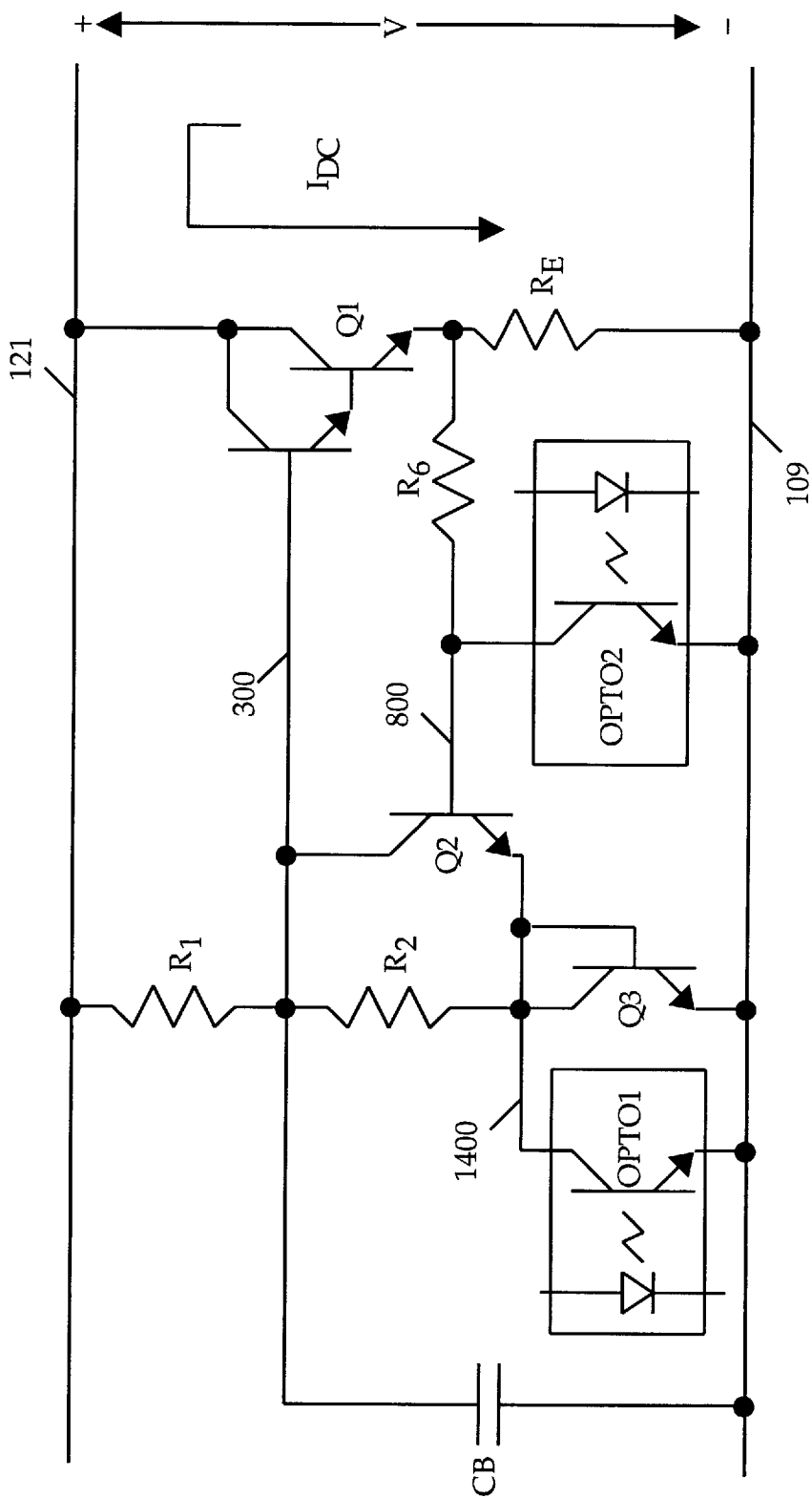
FIG. 14 is a circuit diagram of an artificial inductor having two control elements for selecting between two voltage levels and current limiting or non-current limiting DC modes.

FIG. 14 is a circuit diagram of an embodiment of an artificial inductor that provides current limiting and non-current limiting DC modes, as well as two levels of voltage control and two levels of current limiting. An advantage of the circuit of FIG. 14 over that of FIG. 12 is that only two control elements are utilized, thus saving an opto-coupler with its associated cost and space, plus a control line from the modem controller for other purposes.

In FIG. 14, the collector of Darlington transistor pair Q1 is coupled to node 121, and the base is coupled to node 300. The emitter of Darlington transistor pair Q1 is coupled to node 109 via resistor $R_E$ and node 800 via resistor $R_6$. Resistor $R_1$ is coupled between nodes 121 and 300. Resistor $R_2$ is coupled between node 300 and node 1400. Capacitor CB is coupled between node 300 and node 109. The collector, base and emitter of transistor Q2 are coupled to node 300, node 800 and node 1400, respectively. Control

DC MODES OF FIGURE 12

| OPTO1 | OPTO2 | OPTO3 | $V(I_{DC})$ (Q1 = ON) | $I_{MAX}$ |
|---|---|---|---|---|
| OFF | ON | — | $(I_{DC}R_E + 2V_{BE})(1+ R_1/R_2)$ | — |
| OFF | OFF | OFF | $(I_{DC}R_E + 2V_{BE})(1+ R_1/R_2)$ | $(V_{BE}/R_E)(1+ R_6/(R_4+ R_5))$ |
| OFF | OFF | ON | $(I_{DC}R_E + 2V_{BE})(1+ R_1/R_2)$ | $(V_{BE}/R_E)(1+ R_6/R_4)$ |
| ON | ON | — | $(I_{DC}R_E + 2V_{BE})(1+ R_1/(R_2\|R_3))$ | — |
| ON | OFF | OFF | $(I_{DC}R_E + 2V_{BE})(1+ R_1/(R_2\|R_3))$ | $(V_{BE}/R_E)(1+ R_6/(R_4+ R_5))$ |
| ON | OFF | ON | $(I_{DC}R_E + 2V_{BE})(1+ R_1/(R_2\|R_3))$ | $(V_{BE}/R_E)(1+ R_6/R_4)$ |

Figure 13:
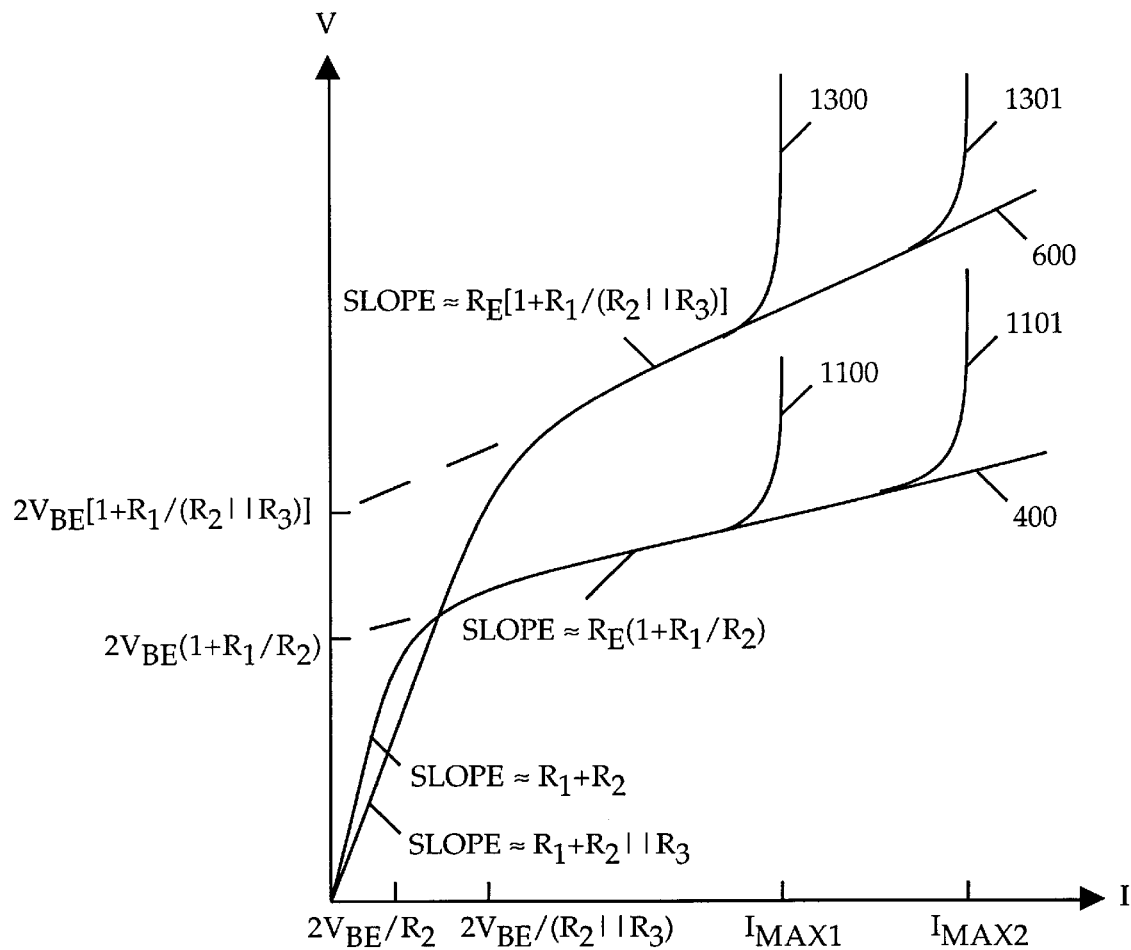
FIG. 13 illustrates the plurality of selectable DC modes provided by the circuit of FIG. 12.

FIG. 13 illustrates the different DC modes provided by the circuit of FIG. 12. Curve 400 represents the DC mode when control elements OPTO1 and OPTO2 are off and on, respectively. Curve 1100 represents the DC mode when control elements OPTO1, OPTO2, and OPTO3 are off, off and off, respectively. Curve 1101 represents the DC mode when control elements OPTO1, OPTO2 and OPTO3 are off, off and on, respectively. Curve 600 represents the DC mode when control elements OPTO1 and OPTO2 are on and on, respectively. Curve 1300 represents the DC mode when control elements OPTO1, OPTO2, and OPTO3 are on, off and off, respectively. Curve 1301 represents the DC mode when control elements OPTO1, OPTO2, and OPTO3 are on, off and on, respectively.

Curves 1100 and 1300 provide current limiting at maximum current $I_{MAX1}$, whereas curves 1101 and 1301 provide element OPTO1 is coupled between node 1400 and node 109, and control element OPTO2 is coupled between 800 and node 109. Npn BJT transistor Q3 is coupled in a diode arrangement with collector and base junctions coupled to node 1400 and the emitter coupled to node 109.

The selectable addition of diode-configured transistor Q3 places a voltage drop of $V_{BE}$ (approximately 0.7 volts) in series with resistor $R_2$, and in series with transistor Q2. With the diode enabled, i.e., with control element OPTO1 off, the voltage of the DC characteristic curve undergoes an offset dependent on the diode voltage drop $V_{BE}$ and the resistor ratio $R_1/R_2$. Further, when current limiting is enabled, the maximum current is doubled when transistor Q3 is enabled. The table below identifies the different modes of FIG. 14.

| | | DC MODES OF FIGURE 14 | | |
|---|---|---|---|---|
| OPTO1 | OPTO2 | MODE | $V(I_{DC})$ (Q1 = ON) | $I_{MAX}$ |
| OFF | OFF | CURRENT LIMIT LOW | $(I_{DC}R_E + V_{BE})(1+ R_1/R_2) + V_{BE}$ | $2V_{BE}/R_E$ |
| OFF | ON | NORMAL LOW | $(I_{DC}R_E + V_{BE})(1+ R_1/R_2) + V_{BE}$ | — |
| ON | OFF | CURRENT LIMIT HIGH | $(I_{DC}R_E + 2V_{BE})(1+ R_1/R_2)$ | $V_{BE}/R_E$ |
| ON | ON | NORMAL HIGH | $(I_{DC}R_E + 2V_{BE})(1,+ \#/R_2)$ | — |

Figure 15:
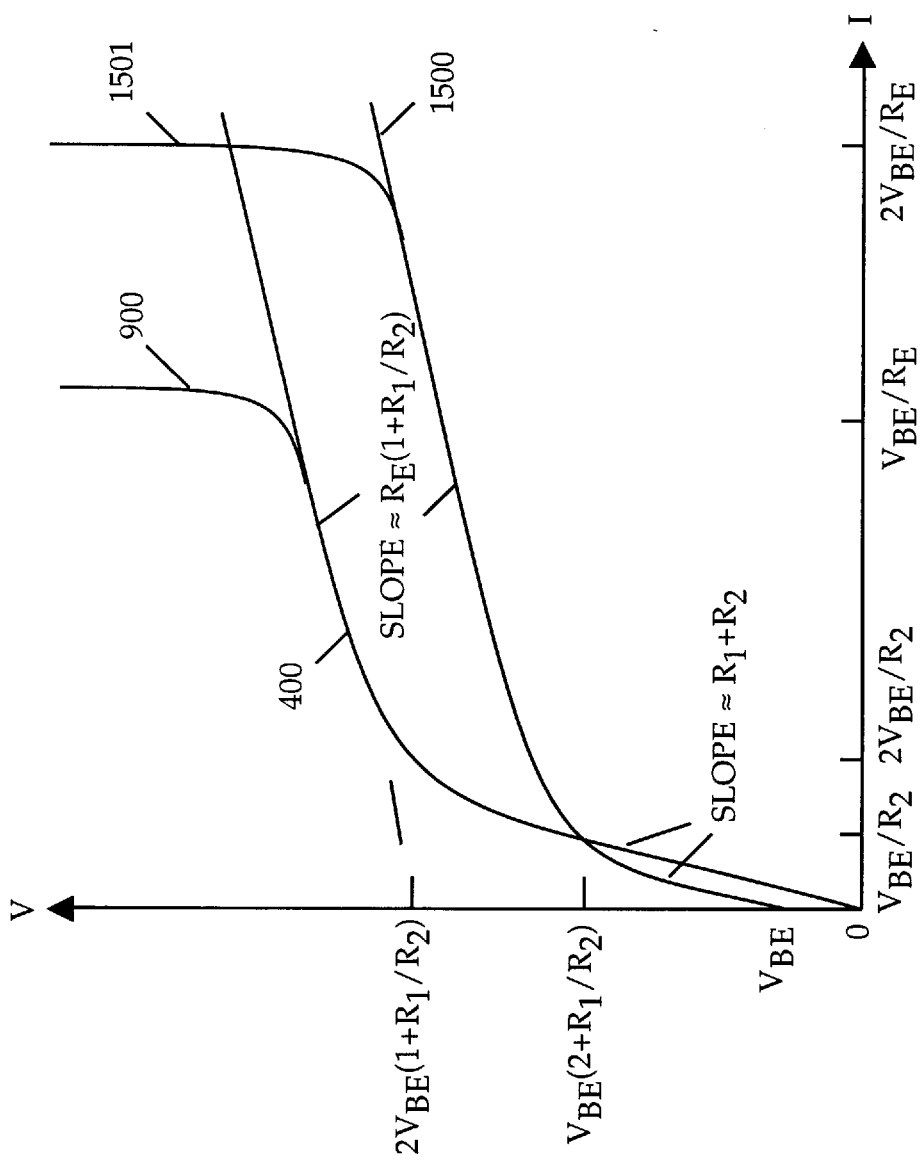
FIG. 15 illustrates the selectable DC modes provided by the circuit of FIG. 14.

FIG. 15 illustrates the DC modes provided by the artificial inductor circuit of FIG. 14. Curve 400 represents the DC mode when control elements OPTO1 and OPTO2 are on. Curve 900 represents the DC mode when control element OPTO1 is on and control element OPTO2 is off. Curve 1500 represents the DC mode when control element OPTO1 is off and control element OPTO2 is on. Curve 1501 represents the DC mode when control elements OPTO1 and OPTO2 are off.

Curves 400 and 900 begin at the origin and rise at a slope of approximately $R_1+R_2$ until Darlington transistor pair Q1 turns on at a voltage V of approximately $2V_{BE}(1+R_1/R_2)$, and current $I_{DC}$ of approximately $2V_{BE}/R_2$. After transistor pair Q1 turns on, curves 400 and 900 rise at a slope of approximately $R_E(1+R_1/R_2)$. Curve 900 is current limited at $I_{MAX1} \approx V_{BE}/R_E$.

Curves 1500 and 1501 begin at zero current with a voltage V of approximately $V_{BE}$ due to the diode offset. Curves 1500 and 1501 rise at a slope of approximately $R_1+R_2$ until transistor pair Q1 turns on at a voltage V of approximately $V_{BE}(2+R_1/R_2)$, and current $I_{DC}$ of approximately $V_{BE}/R_2$. After transistor pair Q1 turns on, curves 1500 and 1501, similarly to curves 400 and 900, rise at a slope of approximately $R_E(1+R_1/R_2)$. Curve 1501 is current limited at a current $I_{DC}$ of $I_{MAX2} \approx 2V_{BE}/R_E$, or approximately two times $I_{MAX1}$. It will be obvious that further diodes could be added in series with transistor Q3 to increase the voltage offset of the selectable modes, as well as increasing the value of $I_{MAX2}$.

Figure 16:
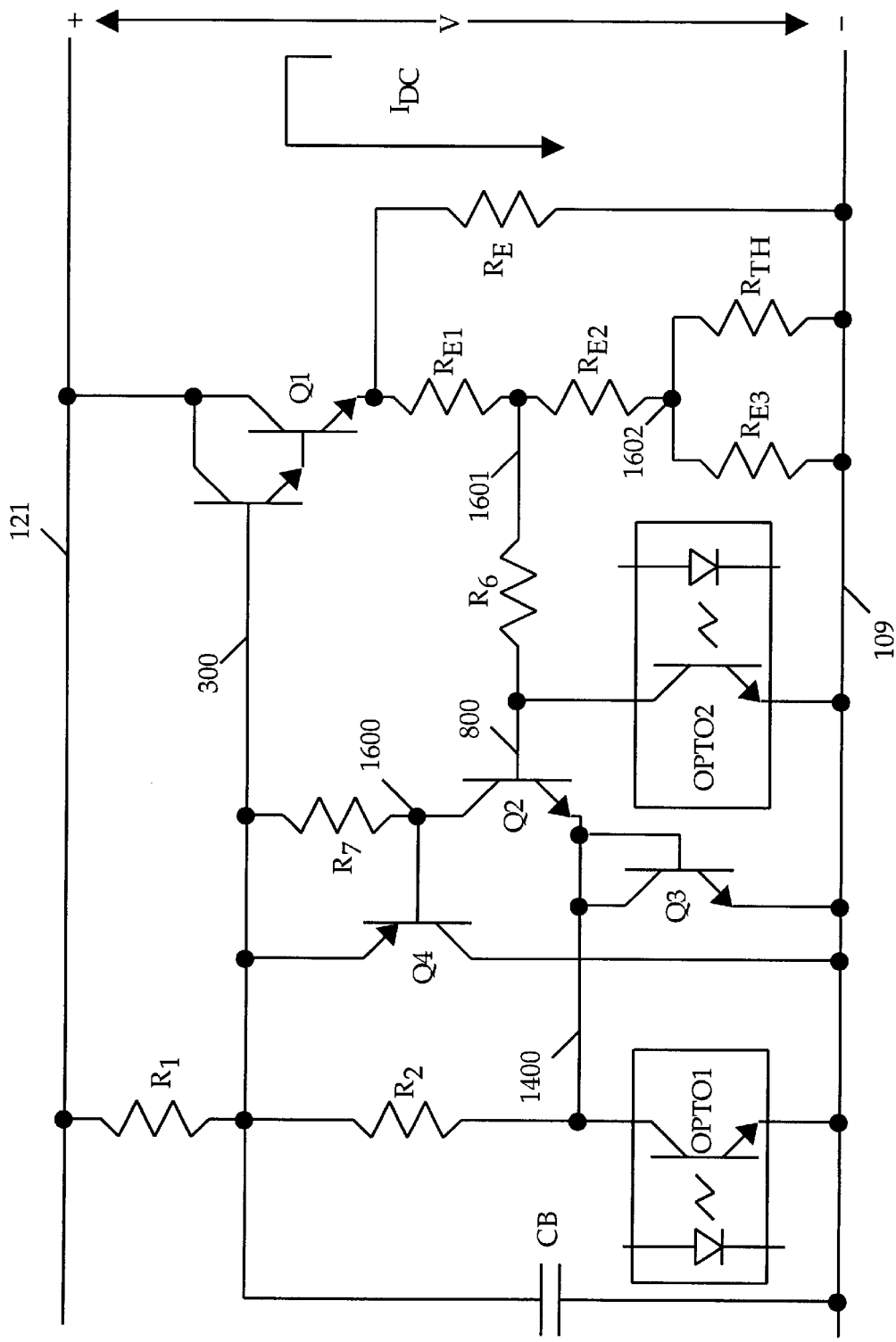
FIG. 16 is a circuit diagram of an artificial inductor having two control elements and temperature compensation circuitry.

FIG. 16 is another embodiment of an artificial inductor. Advantages over the embodiment of FIG. 14 include temperature compensation for maintaining constant current limiting over a range of operating temperatures, current limit points set by a high-impedance voltage divider circuit to provide independence from the value of resistor $R_E$, and improved gain for transistor Q2 due to the addition of pnp BJT transistor Q4 and resistor R7.

In FIG. 16, the collector of Darlington transistor pair Q1 is coupled to node 121, and the base is coupled to node 300. The emitter of Darlington transistor pair Q1 is coupled to node 1601 via resistor $R_{E1}$, and to node 109 via resistor $R_E$. Resistor $R_1$ is coupled between nodes 121 and 300. Resistor $R_2$ is coupled between node 300 and node 1400. Capacitor CB is coupled between node 300 and node 109. Transistor Q3 is diode-configured with collector and base junctions coupled to node 1400, and emitter junction coupled to node 109. The collector, base and emitter junctions of transistor Q2 are coupled to nodes 1600, 800 and 1400, respectively.

Resistor $R_7$ is coupled between node 300 and node 1600. The collector, base and emitter junctions of transistor Q4 are coupled to nodes 109, 1600 and 300, respectively. Resistor $R_6$ is coupled between nodes 800 and 1601. Resistor $R_{E2}$ is coupled between node 1601 and node 1602. Resistor $R_{E3}$ and $R_{TH}$ are coupled in parallel between node 1602 and node 109. Control elements OPTO1 and OPTO2 selectively couple nodes 1400 and 800, respectively, to node 109.

Performance of the circuit of FIG. 16 is similar to that illustrated in FIG. 15. The resistance $R_E$ determines the slope of the DC mode curves for the circuit, due to the smaller size, and therefore greater loading, of resistor $R_E$ relative to resistors $RE_1$, $RE_2$, $RE_3$ and $R_{TH}$ ($R_E$ is typically 10–100 times smaller). Resistors $R_{E1}$, $R_{E2}$, $R_{E3}$ and $R_{TH}$ form a voltage divider for the purposes of determining current limiting values. The result is a scaling of the maximum current by a factor of $k=1+R_{E1}/(R_{E2}+R_{E3}\|R_{TH})$. Having the voltage divider function allows for the current limit points to be set independently of the value of $R_E$. In embodiments without temperature compensation, a single resistor $R_{E4}$ may substitute for the combination of resistors $R_{E2}$, $R_{E3}$ and $R_{TH}$ (in which case, $k=1+R_{E1}/R_{E4}$).

Transistor Q4 and resistor R3 provide an extra stage of amplification to transistor Q2. This provides an increase in gain, but does not change the basic functionality thus far described. The table below identifies the different modes of FIG. 16.

| | | DC MODES OF FIGURE 16 | | |
|---|---|---|---|---|
| OPTO1 | OPTO2 | MODE | $V(I_{DC})$ (Q1 = ON) | $I_{MAX}$ |
| OFF | OFF | CURRENT LIMIT LOW | $(I_{DC}R_E + V_{BE})(1 + R_1/R_2) + V_{BE}$ | $2kV_{BE}/R_E$ |
| OFF | ON | NORMAL LOW | $(I_{DC}R_E + V_{BE})(1+ R_1/R_2) + V_{BE}$ | — |
| ON | OFF | CURRENT LIMIT HIGH | $(I_{DC}R_E + 2V_{BE})(1+ R_1/R_2)$ | $kV_{BE}/R_E$ |
| ON | ON | NORMAL HIGH | $(I_{DC}R_E + 2V_{BE})(1+ R_1/R_2)$ | — |

$k = 1 + (R_{E1}/(R_{E2} + R_{E3} \| R_{TH}))$

V. Temperature Compensation

The PN junction of a transistor exhibits a forward voltage drop ($V_{BE}$) that is dependent on temperature. Typically, the turn-on base-emitter voltage $V_{BE}$ has a negative temperature coefficient of approximately minus two millivolts per degree Celsius (−2 mV/° C.) near room temperature. Because the feedback that transistor Q2 provides to limit current $I_{DC}$ to a prescribed value is of relatively high gain, the current limit point can be sensitive to temperature. To compensate for this sensitivity, a negative temperature coefficient (NTC) resistor (or thermistor), $R_{TH}$, is provided in the circuit of FIG. 16.

Figure 17:
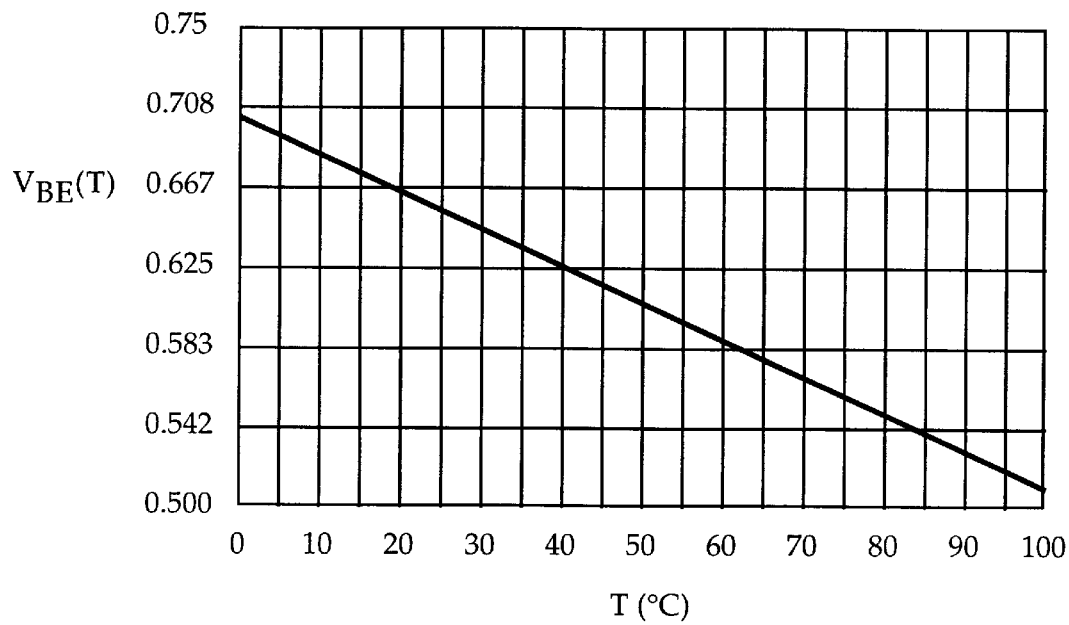
FIG. 17 is a plot of transistor base-emitter turn-on voltage versus temperature.

The temperature dependence of the $V_{BE}$ turn-on voltage for the typical operating temperature range of twenty-five to seventy degrees is approximately given as:

$$V_{BE}(T) \approx 0.655 - 0.00195(T - T_0) \quad \text{[Equation 9]}$$

where T is temperature in degrees Celsius, and $T_0 = 25°$. This linearly modeled relationship is plotted in FIG. 17. The $V_{BE}(T)$ values shown in FIG. 17 are the base-emitter voltages associated with a constant current flow over temperature for a PN junction of a transistor.

As the device gets hotter, the base-emitter voltage required to generate the same amount of current is reduced, or, equivalently, the amount of current generated at the same voltage increases. To maintain constant feedback current in the circuit of FIG. 16, the voltage $V_{B,Q2}$ applied to the base of transistor Q2 must change in a substantially similar temperature-dependent manner as $V_{BE}(T)$, or:

$$V_{B,Q2}(T) \approx V_{BE}(T) \quad \text{[Equation 10]}$$

The voltage applied to the base of transistor Q2 is a function of the voltage $V_{E,Q1}$ at the emitter of transistor Q1, as determined by a voltage divider circuit. Voltage $V_{E,Q1}$ must remain constant for $I_{MAX}$ to remain constant since $V_{E,Q1} \approx I_{MAX} R_E$. Therefore, the voltage divider function provides the temperature compensation. A general equation for the voltage divider function is:

$$V_{B,Q2}(T) \approx V_{E,Q1}\left(\frac{R_L(T)}{R_u + R_L(T)}\right) \quad \text{[Equation 11]}$$

where $R_U$ is the resistance of the upper leg of the voltage divider ($R_{E1}$ in the circuit of FIG. 16), and $R_L(T)$ is the resistance of the lower leg of the voltage divider. $R_L(T)$ represents a temperature dependent resistive arrangement. One embodiment of the invention uses thermistors, or negative temperature coefficient (NTC) resistors, to provide the necessary temperature dependence.

Figure 18:
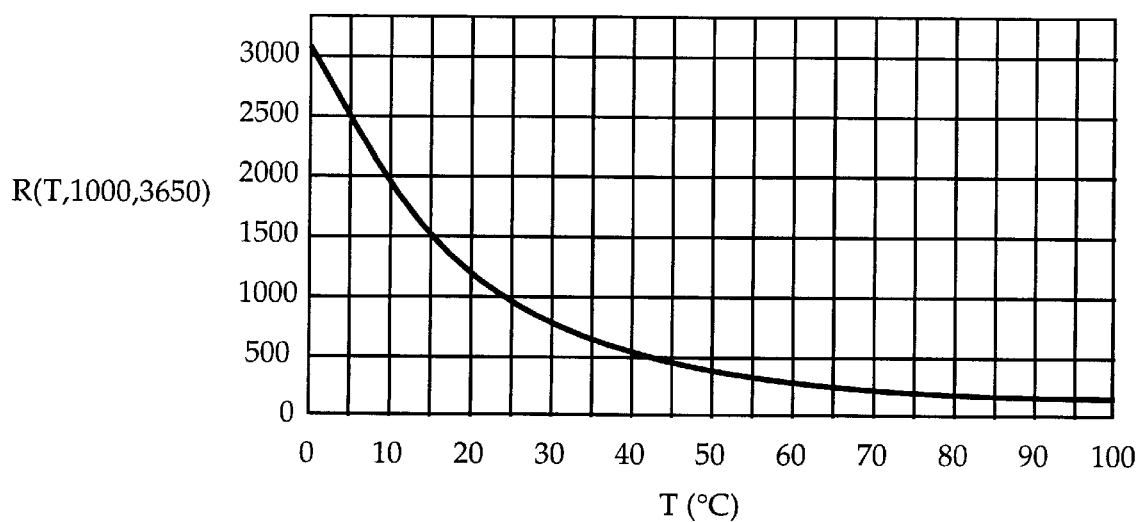
FIG. 18 is a plot of resistance versus temperature for a negative temperature coefficient (NTC) resistor, or thermistor.

Thermistors typically are commercially available in only certain values identified by a reference resistance, $r_0$, and a constant coefficient, B, which relates to the properties of the material used to construct the thermistor. $r_0$ is referenced to temperature $T_0 = 25°$ Celsius. The logarithmic temperature characteristics of a thermistor are given by:

$$R_{TH}(T) \approx R(T, r_0, B) \approx r_0 \exp\left[B\left(\frac{1}{T+273} - \frac{1}{298}\right)\right] \quad \text{[Equation 12]}$$

where temperature T is given in degrees Celsius (with built-in conversion to Kelvin). The logarithmic curve for a thermistor $R(T, r_0, B) = R(T, 1000, 3650)$ is illustrated in FIG. 18.

If the thermistor alone is used to form the lower leg of the voltage divider, the voltage at the base of transistor Q2 is given by:

$$V_{B,Q2}(T) \approx V_{E,Q1}\left(\frac{R_{TH}(T)}{R_{E1} + R_{TH}(T)}\right) \quad \text{[Equation 13]}$$

where $R_{TH}(T)$ is the thermistor value. A thermistor is chosen having given values for B and $r_0$, and the resistance $R_{E1}$ is selected such that $V_{BE}(25°) \approx V_{B,Q2}(25°)$. Evaluating for typical values: B=4100, $r_0$=2000 Ω, $V_{E,Q1}$=1.0V and $R_{E1}$= 1060 Ω; plots of $V_{B,Q2}(T)$ and $V_{BE}(T)$ are provided in FIG. 19. Curve 1900 represents the linearly modeled behavior of $V_{BE}(T)$, and curve 1901 represents the behavior of the voltage divider with the logarithmic influence of the thermistor.

Figure 19:
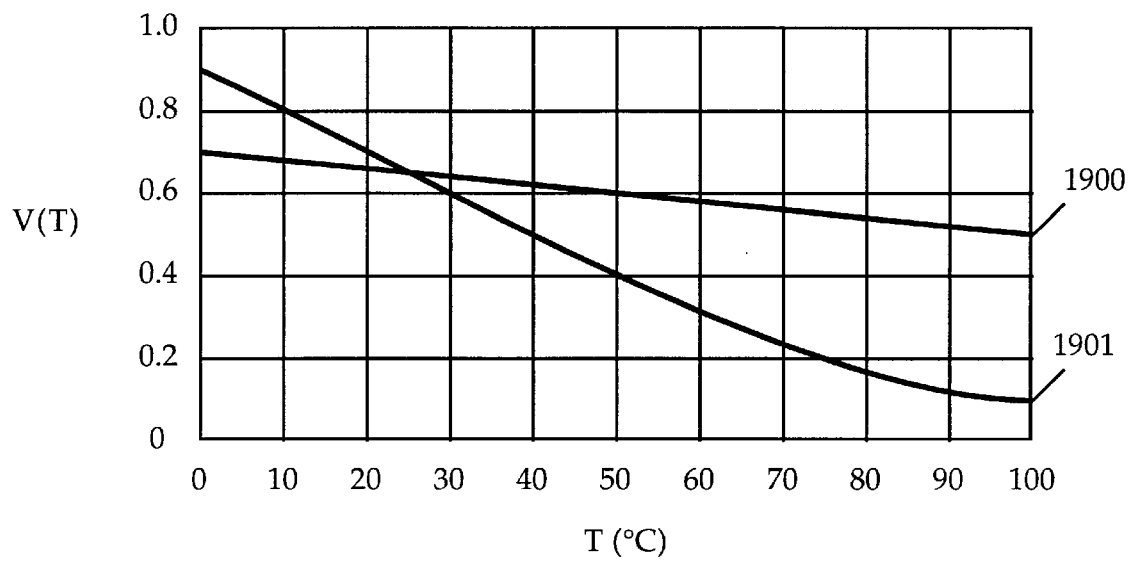
FIG. 19 is a plot of a voltage divider function and the base-emitter turn-on voltage versus temperature, wherein the voltage divider contains a resistor and a thermistor.

As shown by FIG. 19, the behavior of curve 1901 does not match that of curve 1900 very well when the voltage divider contains only a thermistor in the lower leg. Further, with freedom primarily only in the selection of resistance $R_{E1}$ due to the limited values of thermistors available, the two curves are only guaranteed to match at the design point of 25°.

To provide more degrees of freedom, in one embodiment, series resistor $R_{E2}$ and parallel resistor $R_{E3}$ are coupled to the thermistor, as shown in the circuit of FIG. 16. These added elements allow the voltage curves to match at two or more temperatures. Including elements $R_{E2}$ and $R_{E3}$ in the lower leg of the voltage divider, the voltage at the base of transistor Q2 is given by:

$$V_{B,Q2}(T) \approx V_{E,Q1}\left(\frac{R_{E2} + \frac{R_{E3}R_{TH}(T)}{R_{E3}+R_{TH}(T)}}{R_{E1} + R_{E2} + \frac{R_{E3}R_{TH}(T)}{R_{E3}+R_{TH}(T)}}\right) \quad \text{[Equation 14]}$$

To determine the necessary values for $R_{E2}$ and $R_{E3}$, two temperatures, $T_1$ and $T_2$, are selected in the expected range of operation. Given design constraints: $V_{E,Q1}$ (from $V_{E,Q1} = I_{MAX}R_E$), $R_{E1}$ (typical value), $r_0$ and B; the following two simultaneous equations are generated, applying equations [9] and [14]:

$$V_{B,Q2}(T_1) \approx V_{BE}(T_1)$$
$$V_{B,Q2}(T_2) \approx V_{BE}(T_2) \quad \text{[Equations 15–16]}$$

The above simultaneous equations may be solved numerically to determine the two unknowns, $R_{E2}$ and $R_{E3}$. For example, matching at temperatures 25° and 70° Celsius:

$V_{BE}(25°) \approx 0.655V$, $V_{BE}(70°) \approx 0.567V$

Given B=4100 and $r_0$=2000 Ω, $R_{TH}(25°) \approx 2000$ Ω, $R_{TH}(70°) \approx 329$ Ω

For $V_{E,Q1}$=1.0V, $R_{E1}$=1000 Ω, evaluating equations [15–16] for T=25° and 70°, and solving for $R_{E2}$ and $R_{E3}$ yields: $R_{E2} \approx 1041$ Ω and $R_{E3} \approx 1501$ Ω.

Figure 20:
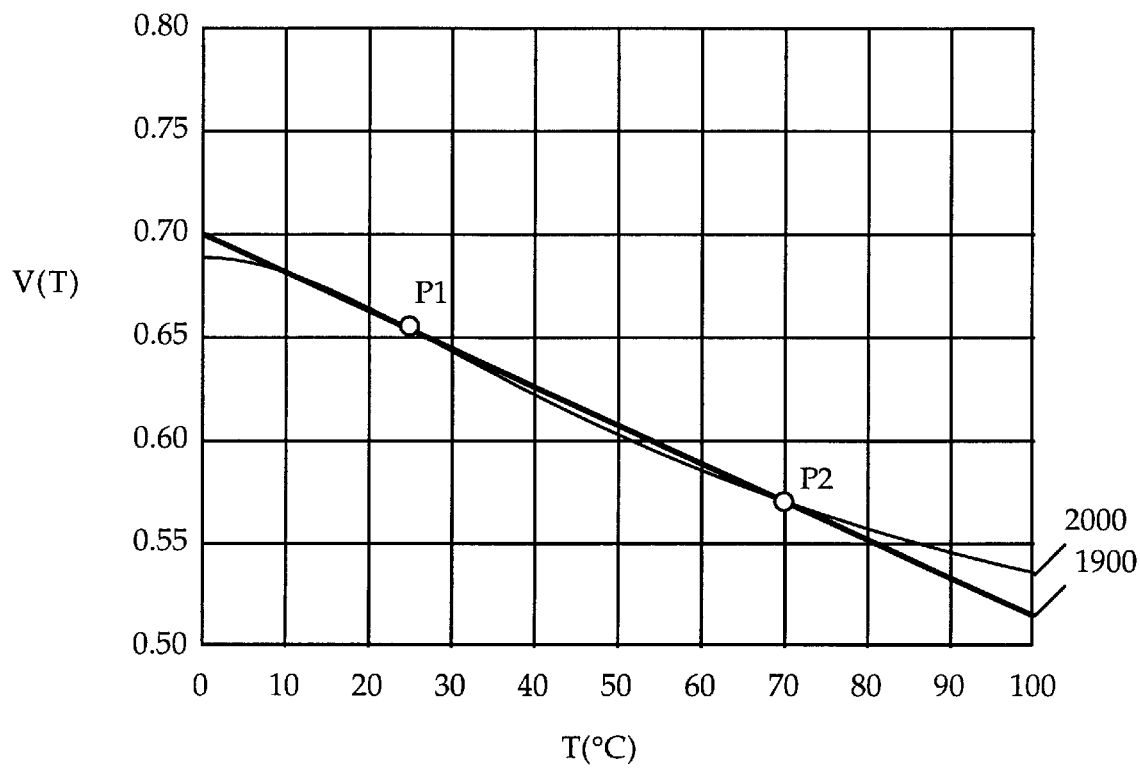
FIG. 20 is a plot of a voltage divider function and the base-emitter turn-on voltage versus temperature, wherein the voltage divider comprises a thermistor with series and parallel resistance.

FIG. 20 illustrates the voltage curves for the above example. Curve 1900 represents a plot of $V_{BE}(T)$, and curve 2000 represents a plot of $V_{B,Q2}(T)$. As shown, curves 1900 and 2000 match at the design points P1(25°) and P2(70°). Further, the curves provide satisfactory matching over the range between the design points, and for some temperature values outside of the specified range.

Thus, in conjunction with resistors $R_{E2}$ and $R_{E3}$, thermistor $R_{TH}$ serves to compensate the current limit points so that they remain stable over the wide range of temperatures likely to be encountered. This temperature compensation arrangement may be applied to any of the current limiting artificial inductor circuits (e.g., FIGS. 8, 10, etc.) to provide current stability over temperature.

Actual transistor device behavior may differ slightly from the linear modeling of $V_{BE}(T)$ in equation [9]. Thus, some minor deviation of actual $V_{BE}(T)$ may occur. Other models may be similarly applied to determine $V_{BE}(T)$ at the chosen design points. For example, SPICE simulations, using more accurate transistor models, may be used to extract $V_{BE}(T)$ values.

Further, where $V_{BE}(T)$ differs when transistor Q3 is enabled in series with transistor Q2, and where more accuracy is desired, the $V_{BE}(T)$ value with transistor Q3 enabled and the $V_{BE}(T)$ value without transistor Q3 enabled may be used to determine an intermediate $V_{BE}(T)$ value at each temperature design point. The respective intermediate $V_{BE}(T)$ values are then used to derive suitable values for $R_{E2}$ and $R_{E3}$. For example, using an averaging approach, the intermediate value $V_{BE}(T)_{INT}$ may be approximated by:

$$V_{BE}(T)_{INT} 26 \left[ \frac{\frac{(V_{BE,Q3}(T) + V_{BE,Q2+}(T))}{2} + V_{BE,Q2-}(T)}{2} \right] \quad [\text{Equation 17}]$$

where $V_{BE,Q3}(T)$ represents $V_{BE}(T)$ for transistor Q3 when transistor Q2 is conducting, $V_{BE,Q2+}(T)$ represents $V_{BE}(T)$ for transistor Q2 with transistor Q3 enabled, and $V_{BE,Q2-}(T)$ represents $V_{BE}(T)$ for transistor Q2 when transistor Q3 is disabled. Depending on the application, other approaches may also be used as desired to determine an intermediate $V_{BE}(T)$ value that provides temperature compensation biased towards one current limiting DC mode over another.

Thus, a method and apparatus for implementing DC mode selection have been described. Particular embodiments described herein are illustrative only and should not limit the present invention thereby. The invention is defined by the claims and their full scope of equivalents.

I claim:

1. A circuit comprising:
   a first transistor having a collector, a base and an emitter, said collector coupled to a first node;
   a first resistance coupled between said emitter of said first transistor and a second node;
   a second transistor having a base coupled to said first resistance and a collector coupled to said base of said first transistor;
   a second resistance coupled between said base of said first transistor and said first node;
   a third resistance coupled between said base of said first transistor and said second node;
   a first control element coupled to said third resistance; and
   a second control element coupled to the base of said second transistor;
   wherein said first control element and said second control element determine a selected DC mode from a plurality of DC modes.

2. The circuit of claim 1, wherein said first control element and said second control element each comprise an opto-coupler.

3. The circuit of claim 1, wherein said first transistor comprises a Darlington transistor pair.

4. The circuit of claim 1 wherein said second resistance and said third resistance are of at least ten times greater resistance than said first resistance.

5. The circuit of claim 1, wherein said second transistor provides DC mode current limiting via feedback to the base of said first transistor.

6. The circuit of claim 5, wherein said second control element provides for enabling or disabling of said DC mode current limiting.

7. The circuit of claim 1, wherein said first control element selects between two DC modes of differing voltage levels.

8. The circuit of claim 7, wherein said first control element further selects between two DC mode current limit values.

9. The circuit of claim 1, further comprising a diode coupled in series with said third resistance.

10. The circuit of claim 9, wherein said first resistance comprises:
    a first resistor coupled between said emitter of said first transistor and said base of said second transistor; and
    a second resistor coupled between said base of said second transistor and said second node.

11. The circuit of claim 1, further comprising:
    a voltage divider coupled between said base of said second transistor and said first resistance; and
    a third control element coupled to said voltage divider.

12. The circuit of claim 11, wherein said third control element determines a DC mode current limit value by altering a ratio of said voltage divider.

13. The circuit of claim 1, wherein said first resistance comprises a thermistor coupled to at least one resistor, said thermistor providing temperature compensation to maintain a substantially constant DC mode current over a range of temperatures.

14. A data access arrangement comprising an artificial inductor coupled across a first node and a second node, said artificial inductor having a selectable DC mode, wherein said artificial inductor comprises:
    a first transistor and a first resistance coupled in series between said first node and said second node;
    a second transistor coupled in feedback between said first resistance and the base of said first transistor to provide current limiting of said DC mode;
    a second resistance and a first impedance coupled in series between said first node and said second node, said second resistance and said first impedance forming a voltage divider, said base of said first transistor coupled to a third node between said second resistance and said first impedance;
    a first control element coupled to said voltage divider to determine a voltage level of said DC mode; and
    a second control element coupled to said second transistor to disable said second transistor.

15. The data access arrangement of claim 14, wherein said first control element selectably enables a third resistance in parallel with said first impedance.

16. The data access arrangement of claim 14, wherein said first control element selectably enables a diode in series with said voltage divider.

17. The data access arrangement of claim 14, wherein said artificial inductor further comprises:
    a second voltage divider between said first transistor and said second transistor; and
    a third control element coupled to said second voltage divider.

18. The data access arrangement of claim 17, wherein said third control element determines a maximum current value by determining a ratio of said second voltage divider.

19. The data access arrangement of claim 14, wherein said first resistance comprises:
    a first resistor coupled between said first transistor and said second transistor; and
    a second resistor coupled between said second transistor and said second node.

20. The data access arrangement of claim 14, wherein said first resistance comprises a thermistor which provides temperature compensation of a DC mode current.

21. A circuit comprising:
a first transistor and a first resistance coupled in series between a first node and a second node;
a first voltage divider coupled between said first and second node, said first voltage divider having an intermediate node coupled to the base of said first transistor;
a second voltage divider coupled in parallel with said first resistance, said second voltage divider comprising a thermistor;
a second transistor coupled between said base of said first transistor and said second node, the base of said second transistor coupled to an intermediate node of said second voltage divider.

22. The circuit of claim 21, wherein said second voltage divider is of at least ten times higher impedance than said first resistance.

23. The circuit of claim 21, wherein said second voltage divider comprises an upper portion and a lower portion, said lower portion comprising said thermistor.

24. The circuit of claim 23, wherein said lower portion further comprises a second resistance in parallel with said thermistor and a third resistance in series with said thermistor.

25. The circuit of claim 21 wherein said second voltage divider compensates for a negative temperature coefficient of said second transistor.

* * * * *